(12) United States Patent
Kim et al.

(10) Patent No.: US 11,101,827 B2
(45) Date of Patent: Aug. 24, 2021

(54) ELECTRONIC DEVICE COMPRISING ANTENNA AND METHOD FOR TRANSMITTING OR RECEIVING SIGNAL

(71) Applicant: Samsung Electronics Co., Ltd., Gyeonggi-do (KR)

(72) Inventors: Yongyoun Kim, Gyeonggi-do (KR); Hyoseok Na, Gyeonggi-do (KR); Kyoungho Kim, Gyeonggi-do (KR); Jungsik Park, Gyeonggi-do (KR); Sunghyup Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/766,975

(22) PCT Filed: Jan. 21, 2019

(86) PCT No.: PCT/KR2019/000834
§ 371 (c)(1),
(2) Date: May 26, 2020

(87) PCT Pub. No.: WO2019/143209
PCT Pub. Date: Jul. 25, 2019

(65) Prior Publication Data
US 2020/0321988 A1 Oct. 8, 2020

(30) Foreign Application Priority Data
Jan. 22, 2018 (KR) .................. 10-2018-0007778

(51) Int. Cl.
*H04B 1/00* (2006.01)
*H05K 5/02* (2006.01)
(Continued)

(52) U.S. Cl.
CPC ............ *H04B 1/0064* (2013.01); *H01Q 1/24* (2013.01); *H01Q 1/48* (2013.01); *H04B 1/40* (2013.01); *H05K 5/0217* (2013.01)

(58) Field of Classification Search
CPC .......... H04B 1/0064; H04B 1/40; H01Q 1/24; H01Q 1/48; H05K 5/0217
(Continued)

(56) References Cited

U.S. PATENT DOCUMENTS 7,843,394 B2  11/2010  Egawa et al.
9,935,359 B2   4/2018  Kim et al.
(Continued)

FOREIGN PATENT DOCUMENTS

CN   107317095 A    11/2017
JP   2006-166262 A   6/2006
(Continued)

OTHER PUBLICATIONS

European Search Report dated Dec. 10, 2020.

*Primary Examiner* — Lee Nguyen
(74) *Attorney, Agent, or Firm* — Cha & Reiter, LLC.

(57) ABSTRACT

Disclosed is an electronic device which includes a housing that includes a first plate, a second plate facing away from the first plate, and a side member surrounding a space between the first plate and the second plate, wherein the side member includes a first conductive portion including a first end and being elongated, a second conductive portion including a second end and a third end and being elongated, the second end being adjacent to the first end, a third conductive portion including a fourth end adjacent to the third end and being elongated, a first insulating portion disposed between the first end and the second end to contact the first end and the second end, and a second insulating
(Continued)

portion disposed between the third end and the fourth end to contact the third end and the fourth end, a display that is exposed through the first plate, at least one wireless communication circuit that is electrically connected with a first point placed at the first conductive portion and adjacent to the first end, a first switching element electrically connected with a second point, which is placed at the second conductive portion and is adjacent to the third end, through a capacitive element and electrically connected with a third point placed at the second conductive portion and adjacent to the third end, and a fourth point placed at the third conductive portion and adjacent to the fourth end, at least one ground member that is electrically connected with a fifth point placed at the first conductive portion and more distant from the first end than the first point, a second switching element electrically connected with a sixth point placed at the second conductive portion and adjacent to the second end, a seventh point placed at the second conductive portion and adjacent to the third point, and an eighth point placed at the third conductive portion and more distant from the fourth end than the fourth point, and a control circuit that is configured to control the first switching element and the second switching element. Moreover, various embodiment found through the present disclosure are possible.

15 Claims, 14 Drawing Sheets

(51) Int. Cl.
  *H01Q 1/24* (2006.01)
  *H01Q 1/48* (2006.01)
  *H04B 1/40* (2015.01)

(58) Field of Classification Search
  USPC .......................................................... 455/73
  See application file for complete search history.

(56) References Cited

U.S. PATENT DOCUMENTS

| | | | |
|---|---|---|---|
| 10,015,294 | B2 | 7/2018 | Lee et al. |
| 10,516,772 | B2 | 12/2019 | Lee et al. |
| 2016/0301139 | A1 | 10/2016 | Lombardi et al. |
| 2016/0344439 | A1 | 11/2016 | Seol et al. |
| 2017/0005393 | A1 | 1/2017 | Wu |
| 2017/0040668 | A1 | 2/2017 | Ayala Vazquez et al. |
| 2017/0048363 | A1 | 2/2017 | Lee et al. |
| 2017/0244151 | A1* | 8/2017 | Han .......................... H01Q 5/30 |
| 2020/0036820 | A1 | 1/2020 | Lee et al. |
| 2020/0076059 | A1* | 3/2020 | Hsiao ....................... H01Q 9/42 |

FOREIGN PATENT DOCUMENTS

| | | |
|---|---|---|
| JP | 2013-123086 A | 6/2013 |
| KR | 10-2016-0146138 A | 12/2016 |
| KR | 10-2017-0136292 A | 12/2017 |

\* cited by examiner

ELECTRONIC DEVICE COMPRISING ANTENNA AND METHOD FOR TRANSMITTING OR RECEIVING SIGNAL

CROSS-REFERENCE TO RELATED APPLICATION(S)

This application is a National Phase Entry of PCT International Application No. PCT/KR2019/000834, which was filed on Jan. 21, 2019, and claims priority to Korean Patent Application No. 10-2018-0007778, which was filed on Jan. 22, 2018, the contents of which are incorporated herein by reference.

TECHNICAL FIELD

The disclosure relates to a technology for transmitting or receiving a signal through an antenna at an electronic device or disposing the antenna for signal transmission or reception.

BACKGROUND ART

An electronic device such as a smartphone, a tablet PC, or the like may communicate with a network by using an antenna element. The antenna element provided in the electronic device may be formed of a conductive material. To improve a design of the electronic device, nowadays, a side surface of the electronic device may be implemented with a metal frame. In this case, the metal frame may be used as an antenna element.

DISCLOSURE

Technical Problem

Antenna elements of various lengths are required to transmit/receive signals in various frequency bands. Various portions of a housing of an electronic device may be used as antenna elements. In this case, the antenna elements may be adjacent to each other due to the limitation of a mounting space of the housing, thereby causing a decrease in the efficiency of antenna in transmitting/receiving signals.

Various embodiments of the disclosure are to provide an antenna structure capable of increasing performance of adjacent antenna elements and a method for transmitting or receiving a signal.

Technical Solution

An electronic device according to an embodiment of the disclosure may include a housing that includes a first plate, a second plate facing away from the first plate, and a side member surrounding a space between the first plate and the second plate, wherein the side member includes a first conductive portion including a first end and being elongated, a second conductive portion including a second end and a third end and being elongated, the second end being adjacent to the first end, a third conductive portion including a fourth end adjacent to the third end and being elongated, a first insulating portion disposed between the first end and the second end to contact the first end and the second end, and a second insulating portion disposed between the third end and the fourth end to contact the third end and the fourth end, a display that is exposed through the first plate, at least one wireless communication circuit that is electrically connected with a first point placed at the first conductive portion and adjacent to the first end, a first switching element electrically connected with a second point, which is placed at the second conductive portion and is adjacent to the third end, through a capacitive element and electrically connected with a third point placed at the second conductive portion and adjacent to the third end, and a fourth point placed at the third conductive portion and adjacent to the fourth end, at least one ground member that is electrically connected with a fifth point placed at the first conductive portion and more distant from the first end than the first point, a second switching element electrically connected with a sixth point placed at the second conductive portion and adjacent to the second end, a seventh point placed at the second conductive portion and adjacent to the third point, and an eighth point placed at the third conductive portion and more distant from the fourth end than the fourth point, and a control circuit that is configured to control the first switching element and the second switching element.

An electronic device according to an embodiment of the disclosure may include a housing that includes a first plate, a second plate facing away from the first plate, and a side member surrounding a space between the first plate and the second plate, wherein the side member includes a first conductive portion including a first end and being elongated, a second conductive portion including a second end and a third end and being elongated, the second end being adjacent to the first end, a third conductive portion including a fourth end adjacent to the third end and being elongated, a first insulating portion disposed between the first end and the second end to contact the first end and the second end, and a second insulating portion disposed between the third end and the fourth end to contact the third end and the fourth end, a display exposed through the first plate, at least one wireless communication circuit that is electrically connected with a first point placed at the first conductive portion and adjacent to the first end, a first switching element electrically connected with a second point placed at the second conductive portion and adjacent to the third end, a second switching element electrically connected with a third point placed at the second conductive portion and adjacent to the second end, and a fourth point placed at the third conductive portion and adjacent to the fourth end, at least one ground member that is electrically connected with a fifth point placed at the first conductive portion and more distant from the first end than the first point, a third switching element electrically connected with a sixth point placed at the second conductive portion and adjacent to the second end, a fourth switching element electrically connected with a seventh point placed at the second conductive portion and adjacent to the second end, and an eighth point placed at the third conductive portion and more distant from the fourth end than the fourth point, and a control circuit that is configured to control the first switching element to the fourth switching element.

Advantageous Effects

According to embodiments of the disclosure, signal transmission/reception performance between adjacent antennas may be improved.

According to embodiments of the disclosure, a signal may be transmitted or received even in a carrier aggregation situation.

Besides, a variety of effects directly or indirectly understood through this disclosure may be provided.

DESCRIPTION OF DRAWINGS

With regard to description of drawings, similar components may be marked by similar reference numerals.

MODE FOR INVENTION

Hereinafter, various embodiments of the disclosure will be described with reference to accompanying drawings. However, those of ordinary skill in the art will recognize that modification, equivalent, and/or alternative on various embodiments described herein can be variously made without departing from the scope and spirit of the disclosure.

Figure 1A:
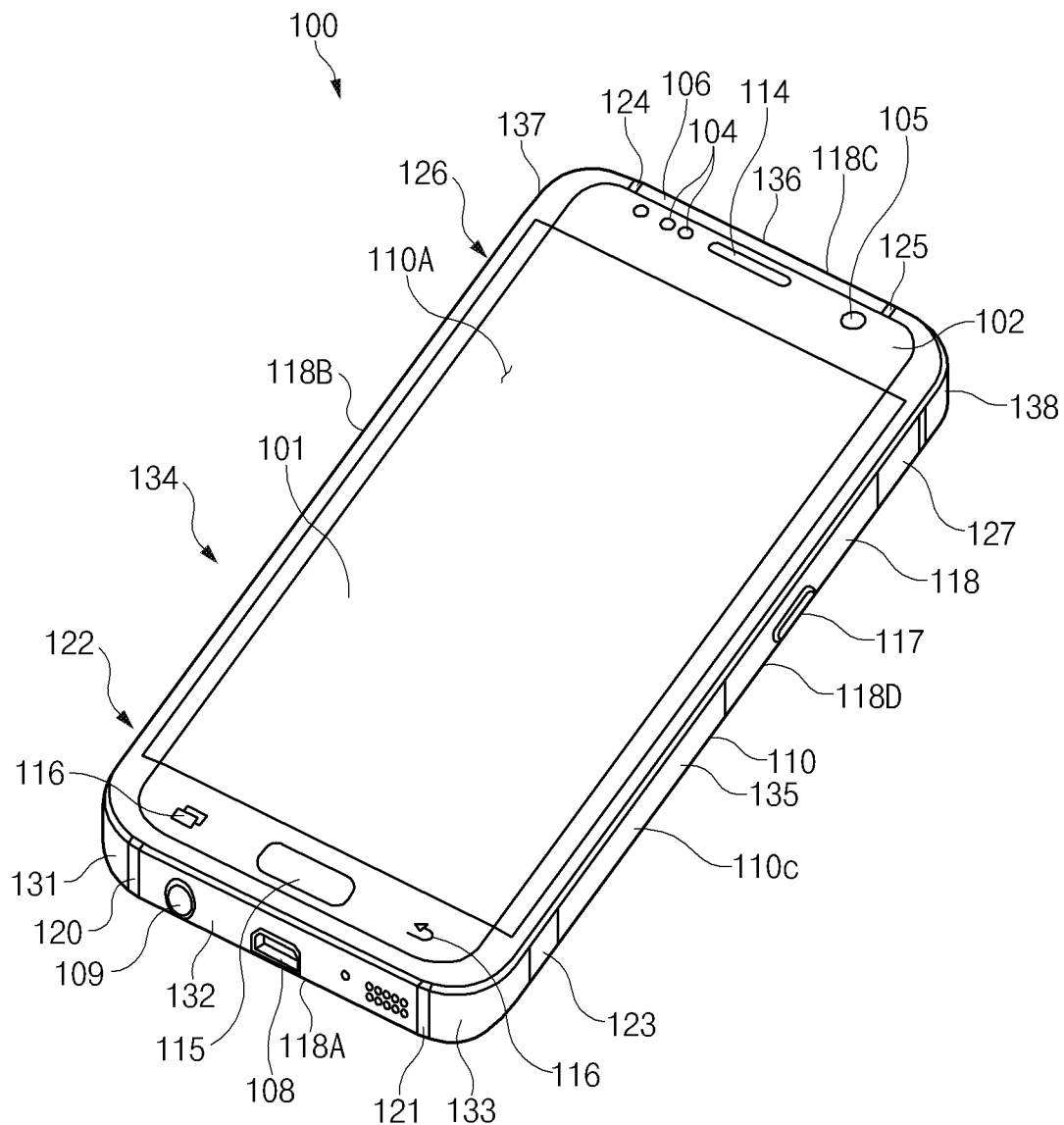
FIG. 1A is a front perspective view of a mobile electronic device according to an embodiment.

FIG. 1A is a front perspective view of a mobile electronic device according to an embodiment.

Figure 1B:
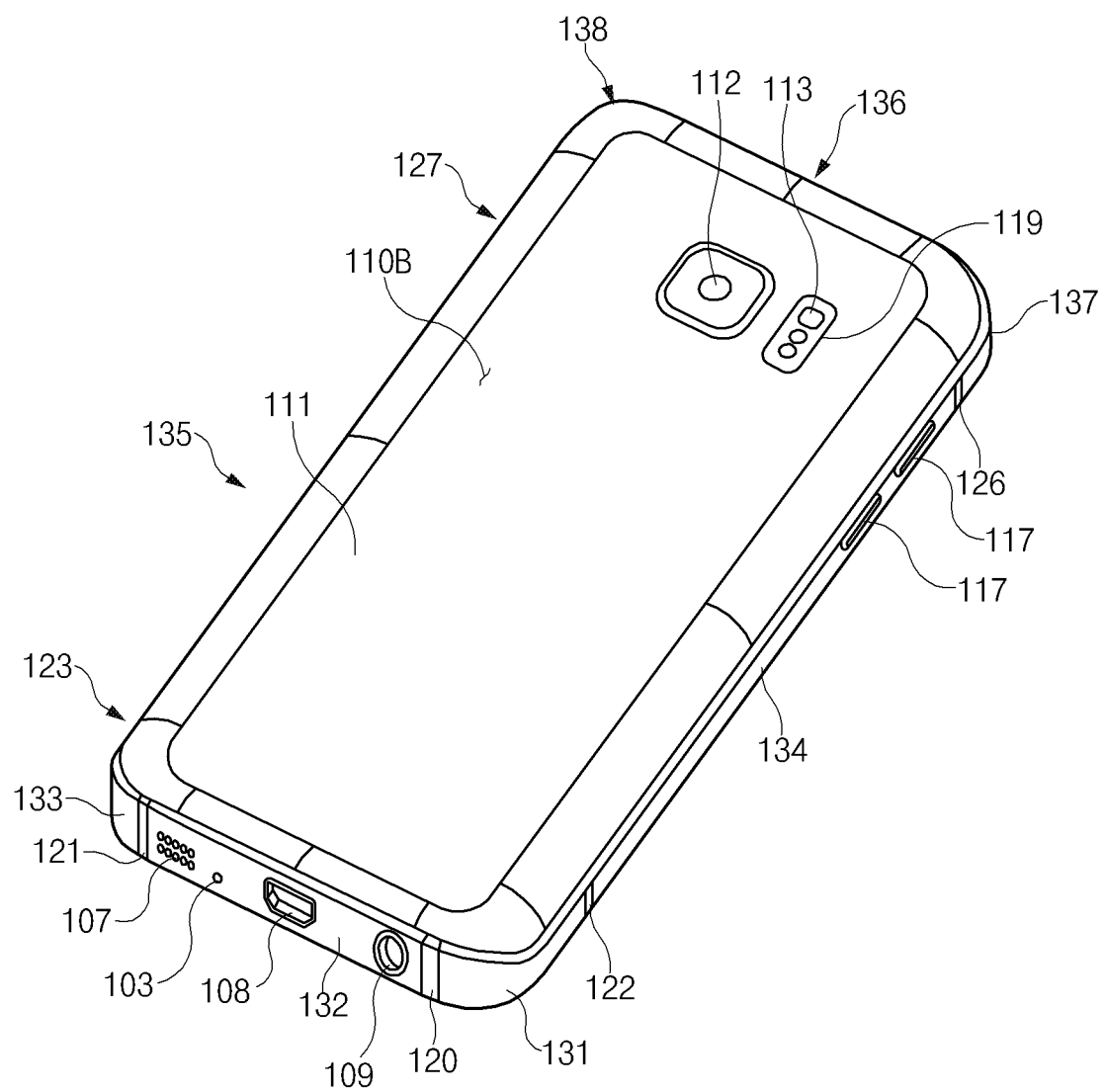
FIG. 1B is a back perspective view of an electronic device of FIG. 1A.

FIG. 1B is a back perspective view of an electronic device of FIG. 1A.

Referring to FIGS. 1A and 1B, an electronic device 100 according to an embodiment may include a housing 110 including a first surface (or a front surface) 110A, a second surface (or a back surface) 110B, and a side surface 110C surrounding a space between the first surface 110A and the second surface 110B. In another embodiment (not illustrated), the housing 110 may be referred to as a "structure" that forms a part of the first surface 110A, the second surface 110B, and the side surface 110C of FIG. 1A.

According to an embodiment, the first surface 110A may be implemented with a first plate (or a front plate) 102 (e.g., a glass plate including various coating layers, or a polymer plate), at least a portion of which is substantially transparent.

According to an embodiment, the second surface 110B may be implemented with a second plate (or a back plate) 111. For example, the second plate 111 may be formed of coated or colored glass, ceramic, polymer, metal (e.g., aluminum, stainless steel (STS), or magnesium), or a combination of at least two of the materials.

According to an embodiment, the side surface 110C may be coupled to the first plate 102 and the second plate 111 and may be implemented with a side bezel structure (or a "side member) 118 including metal and/or polymer. In any embodiment, the second plate 111 and the side bezel structure 118 may be integrally formed and may include the same material (e.g., a metal material such as aluminum).

According to an embodiment, the side surface 110C or the side member 118 may include at least one non-conductive portion 120 or 121 for the purpose of transmitting and/or receiving a signal according to an embodiment. According to an embodiment, the non-conductive portion 120 or 121 may be filled with a non-conductive material.

According to an embodiment, the side surface 110C or the side member 118 may include a plurality of insulating portions 120, 121, 122, 123, 124, 125, 126, and 127 and a plurality of conductive portions 131, 132, 133, 134, 135, 136, 137, and 138 spaced from each other by the insulating portions 120, 121, 122, 123, 124, 125, 126, and 127 on various sides. In the specification, the number of insulating portions, an arrangement of a plurality of conductive portions, and/or the number of conductive portions may be variously changed according to various embodiments. For example, the electronic device 100 may not include some insulating portions 122 and 123.

At least a part (e.g., 120) of the insulating portions 120, 121, 122, 123, 124, 125, 126, and 127 may be interposed between two conductive portions 131 and 132 and may be disposed to contact and/or meet the conductive portions (131, 132).

According to an embodiment, one side of the side surface 110C or the side member 118 may include the first insulating portion 120 and the second insulating portion 121. The side surface 110C may include the first conductive portion 131, the second conductive portion 132, and/or the third conductive portion 133 spaced from each other by the first insulating portion 120 and the second insulating portion 121. At least a part of the first conductive portion 131, the second conductive portion 132, and/or the third conductive portion 133 may be disposed on one side of the side member 118. The one side may be a first side 118A of the side member 118.

According to an embodiment, the second conductive portion 132 may be interposed between the first insulating portion 120 and the second insulating portion 121, the first conductive portion 131 may be spaced from the second conductive portion 132 by the first insulating portion 120, and the third conductive portion 133 may be spaced from the second conductive portion 132 by the second insulating portion 121.

According to an embodiment, another side of the side surface 110C or the side member 118 may include the third insulating portion 122 and the fourth insulating portion 126. The side surface 110C may include the first conductive portion 131, the fourth conductive portion 134, and/or the fifth conductive portion 137 spaced from each other by the third insulating portion 122 and the fourth insulating portion 126. At least a part of the first conductive portion 131, the fourth conductive portion 134, and/or the fifth conductive portion 137 may be disposed on another side of the side member 118. The another side may be a second side 118B of the side member 118.

According to an embodiment, the fourth conductive portion 134 may be interposed between the third insulating portion 122 and the fourth insulating portion 126, the first conductive portion 131 may be spaced from the fourth conductive portion 134 by the third insulating portion 122, and the fifth conductive portion 137 may be spaced from the fourth conductive portion 134 by the fourth insulating portion 126.

According to an embodiment, another side of the side surface 110C or the side member 118 may include the fifth insulating portion 124 and the sixth insulating portion 125. The side surface 110C may include the fifth conductive portion 137, the sixth conductive portion 136, and/or the seventh conductive portion 138 spaced from each other by the fifth insulating portion 124 and the sixth insulating portion 125. At least a part of the fifth conductive portion 137, the sixth conductive portion 136, and/or the seventh conductive portion 138 may be disposed on the another side of the side member 118. The another side may be a third side 118C of the side member 118.

According to an embodiment, the sixth conductive portion 136 may be interposed between the fifth insulating portion 124 and the sixth insulating portion 125, the fifth conductive portion 137 may be spaced from the sixth conductive portion 136 by the fifth insulating portion 124, and the seventh conductive portion 138 may be spaced from the sixth conductive portion 136 by the sixth insulating portion 125.

According to an embodiment, the other side of the side surface 110C or the side member 118 may include the seventh insulating portion 127 and the eighth insulating portion 123. The side surface 110C may include the seventh conductive portion 138, the eighth conductive portion 135, and/or the third conductive portion 133 spaced from each other by the seventh insulating portion 127 and the eighth insulating portion 123. At least a part of the seventh conductive portion 138, the eighth conductive portion 135, and/or the third conductive portion 133 may be disposed on the another side of the side member 118. The other side may be a fourth side 118D of the side member 118.

According to an embodiment, the sixth conductive portion 136 may be interposed between the fifth insulating portion 124 and the sixth insulating portion 125, the fifth conductive portion 137 may be spaced from the sixth conductive portion 136 by the fifth insulating portion 124, and the seventh conductive portion 138 may be spaced from the sixth conductive portion 136 by the sixth insulating portion 125.

According to an embodiment, the side member 118 may include the first side 118A that has a first length and is extended in a first direction (e.g., +y or −y), the second side 118B that has a second length and is extended in a second direction (e.g., +x or −x) different from the first direction, the third side 118C that has the first length and is extended in parallel with the first side 118A, and the fourth side 118D that has the second length and is extended in parallel with the second side 118B, when viewed from above the front surface 110A. The first direction and the second direction may be perpendicular to each other. According to an embodiment, the second length may be smaller than the first length.

According to an embodiment, the electronic device 100 may include at least one or more of a display 101, an audio module (103, 107, 114), a sensor module (104, 119), a camera module (105, 112, 113), a key input device (115, 116, 117), an indicator 106, and a connector hole (108, 109). In any embodiment, the electronic device 100 may not include at least one (e.g., the key input device (115, 116, 117) or the indicator 106) of the components or may further include any other component.

The display 101 may be exposed through a considerable portion of the first plate 102, for example. The display 101 may be coupled to a touch sensing circuit, a pressure sensor capable of measuring the intensity (or pressure) of a touch, and/or a digitizer detecting a magnetic stylus pen or may be disposed adjacent thereto.

According to an embodiment, the audio module (103, 107, 114) may include a microphone hole 103 and a speaker hole (107, 114). A microphone for obtaining external sound may be disposed within the microphone hole 103; in an embodiment, a plurality of microphones may be disposed to detect a direction of sound. The speaker hole (107, 114) may include an external speaker hole 107 and a receiver hole 114 for call. In an embodiment, the speaker hole (107, 114) and the microphone hole 103 may be implemented with one hole, or a speaker (e.g., a piezoelectric speaker) may be included without the speaker hole (107, 114).

According to an embodiment, the sensor module (104, 119) may generate an electrical signal or a data value that corresponds to an internal operation state of the electronic device 100 or corresponds to an external environment state. The sensor module (104, 119) may include, for example, a first sensor module 104 (e.g., a proximity sensor) and/or a second sensor module (not illustrated) (e.g., a fingerprint sensor) disposed on the first surface 110A of the housing 110, and/or a third sensor module 119 (e.g., a HRM sensor) disposed on the second surface 110B of the housing 110.

According to an embodiment, the fingerprint sensor may be disposed on the second surface 110B as well as the first surface 110A (e.g., a home key button 115) of the housing 110. The electronic device 100 may further include a sensor module not illustrated, for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or the illumination sensor.

According to an embodiment, the camera module (105, 112, 113) may include a first camera device 105 disposed on the first surface 110A of the electronic device 100, and a second camera module 112 and/or a flash 113 disposed on the second surface 110B. The camera module (105, 112) may include one lens or a plurality of lenses, an image sensor, and/or an image signal processor. The flash 113 may include, for example, a light-emitting diode or a xenon lamp. In any embodiment, two or more lenses (wide-angle and telephoto lenses) and image sensors may be disposed on one surface of the electronic device 100.

According to an embodiment, the key input device (115, 116, 117) may include the home key button 115 disposed on the first surface 110A of the housing 110, touch pads 116 disposed around the home key button 115, and/or a side key button 117 disposed on the side surface 110C of the housing 110. In another embodiment, the electronic device 100 may not include all or a part of the key input device (115, 116, 117) mentioned above, and the key input device (115, 116, 117) not included may be implemented on the display 101 in the form of a soft key or the like.

According to an embodiment, the indicator 106 may be disposed, for example, on the first surface 110A of the housing 110. The indicator 106 may provide status information of the electronic device 100, for example, in the form of light and may include an LED.

According to an embodiment, the connector hole (108, 109) may include a first connector hole 108 that is capable of accommodating a connector (e.g., a USB connector) for transmitting/receiving a power and/or data with an external electronic device, and/or a second connector hole (or an earphone jack) 109 that is capable of accommodating a connector for transmitting/receiving an audio signal with the external electronic device.

Figure 1C:
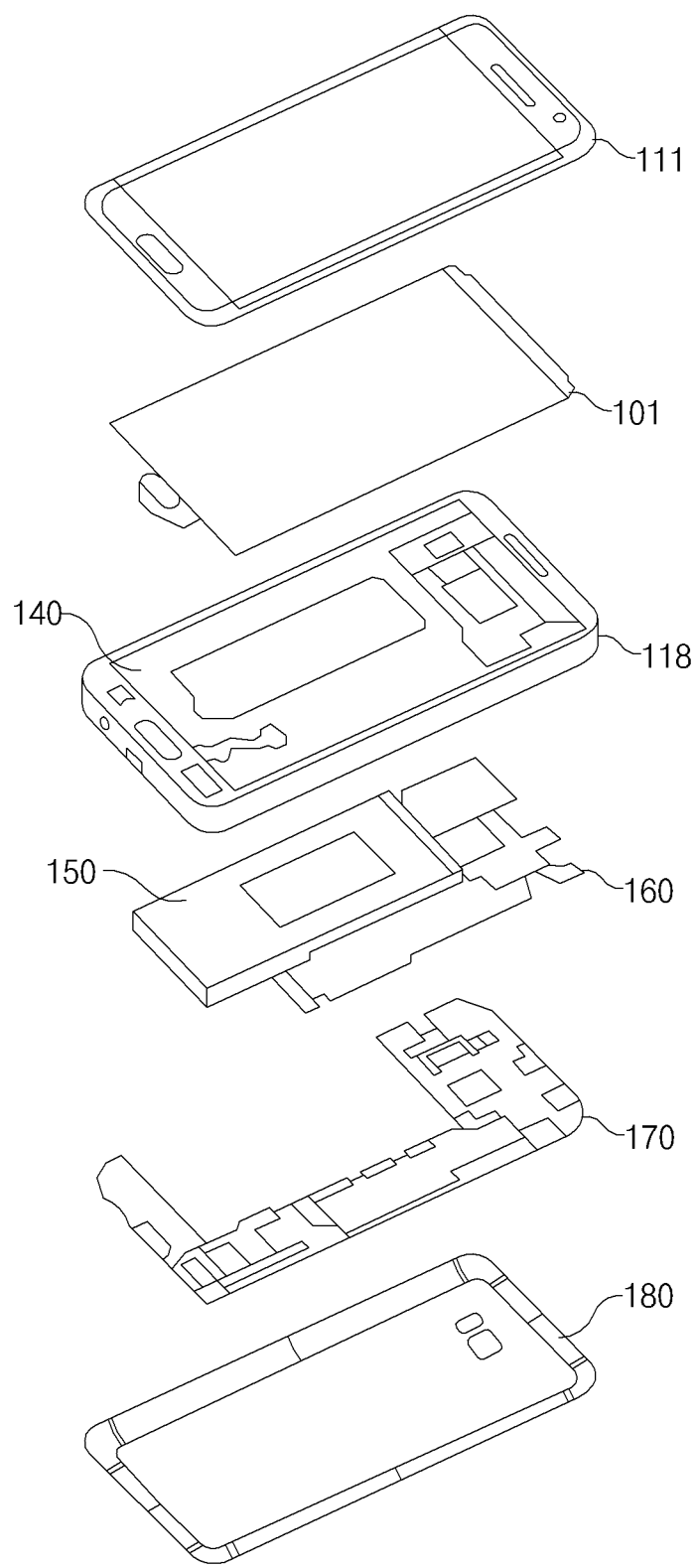
FIG. 1C is an exploded perspective view of an electronic device of FIG. 1A.

FIG. 1C is an exploded perspective view of an electronic device of FIG. 1A, according to an embodiment of the disclosure.

Referring to FIG. 1C, the electronic device 100 may include the side bezel structure 118, a first support member 140 (e.g., a bracket), a first plate 102, the display 101, a substrate 160, a battery 150, a second support member 170 (e.g., a rear case), and a second plate 111. In an embodiment, the electronic device 100 may not include at least one (e.g., the first support member 140 or the second support member 170) of the components or may further include any other component. At least one of the components of the electronic device 100 may be identical or similar to at least one of the components of the electronic device 100 of FIG. 1A or 1B, and thus, additional description will be omitted to avoid redundancy.

The first support member 140 may be disposed within the electronic device 100, and the first support member 140 may be connected with the side bezel structure 118 or may be integrally formed with the side bezel structure 118. The first support member 140 may be formed of, for example, a metal material and/or a nonmetal material (e.g., polymer). The display 101 may be coupled to one surface of the first support member 140, and the substrate 160 may be coupled to an opposite surface of the substrate 160. A processor, a memory, and/or an interface may be mounted on the substrate 160. According to an embodiment, the substrate 160 that is a printed circuit board (PCB) may be a main PCB. The processor may include, for example, one or more of a central processing unit, an application processor, a graphic processing device, an image signal processor, a sensor hub processor, or a communication processor.

The memory may include, for example, a volatile memory or a nonvolatile memory.

The interface may include, for example, a high definition multimedia interface (HDMI), a universal serial bus (USB) interface, an SD card interface, and/or an audio interface. The interface may electrically or physically connect, for example, the electronic device 100 with the external electronic device and may include a USB connector, an SD card/MMC connector, or an audio connector.

The battery 150 that is a device for supplying a power to at least one component of the electronic device 100 may include, for example, a primary cell incapable of being recharged, a secondary cell rechargeable, or a fuel cell. At least a portion of the battery 150 may be disposed on substantially the same plane as the printed circuit board 160, for example. The battery 150 may be integrally disposed within the electronic device 100 or may be disposed to be removable from the electronic device 100.

Figure 2:
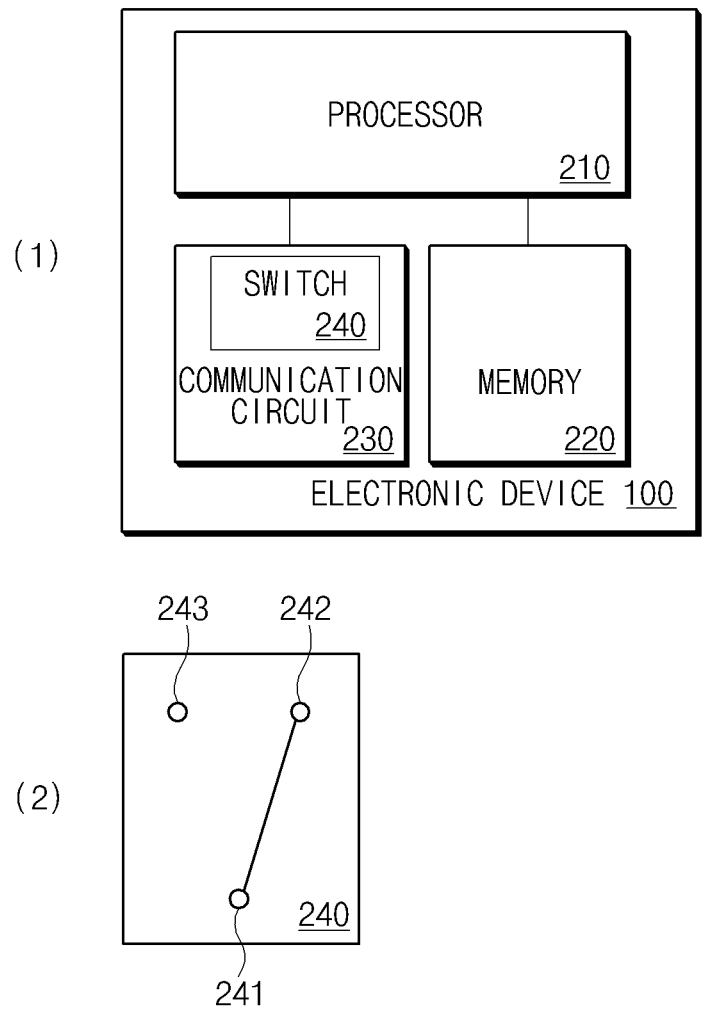
FIG. 2 is a configuration block diagram of an electronic device according to an embodiment.

FIG. 2 is a configuration block diagram of an electronic device according to an embodiment.

Referring to FIG. 2, the electronic device 100 (e.g., the electronic device 100 of FIG. 1) may include a processor 210, a memory 220, or a communication circuit 230 (e.g., a communication module 290 of FIG. 13)

According to an embodiment, the components may be disposed within a housing (e.g., the housing 110 of FIG. 1). The housing may include, for example, a front plate (e.g., the front surface 110A of FIG. 1A), a back plate (e.g., the back surface 110B of FIG. 1B) facing away from the front plate, and a side member (or a metal frame) (e.g., the side member 118 of FIG. 1A) surrounding a space between the front plate and the back plate. The side member may be attached to the back plate or may be integrally formed with the back plate.

According to an embodiment, the processor 210 may include one or more of a central processing unit, an application processor, a graphic processing unit (GPU), an image signal processor of a camera, or a baseband processor (or a communication processor (CP)). According to an embodiment, the processor 210 may be implemented with a system on chip (SoC) or a system in package (SiP). According to an embodiment, the processor 210 may be included in a control circuit depending on various embodiments of the disclosure.

According to an embodiment, the processor 210 may execute (or perform) various operations of the electronic device 100 disclosed in the specification or may allow any other components to execute operations below.

According to an embodiment, the memory 220 may store instructions that cause the processor 210 to execute various operations disclosed in the specification. The memory 220 may be electrically connected with the processor 210.

According to an embodiment, the communication circuit 230 may transfer electrical signals to antenna elements according to various embodiments of the disclosure. The communication circuit 230 may be electrically connected with at least one conductive portion by using at least one conductive line.

The communication circuit 230 may include a baseband processor, an RFIC, or an IFIC. The communication circuit 230 may include a baseband processor that is independent of the processor 210 (e.g., an application processor (AP)). The conductive line may include, for example, a coaxial cable or an FPCB. According to an embodiment, the communication circuit 230 may support wireless communication. For example, the communication circuit 230 may support various wireless communication such as cellular communication, Wi-Fi communication, or Bluetooth communication. According to an embodiment, the communication circuit 230 may be electrically connected with the processor 210, and the processor 210 may control at least a part of operations of the communication circuit 230.

According to an embodiment, the control circuit 230 may include a switch 240. The switch 240 may change an operating mode depending on various embodiments of the disclosure. The switch 240 may be electrically connected with the processor 210 or the communication circuit 230 and may be controlled by the processor 210 or a processor in the communication circuit 230. In various embodiments, the switch 240 may be referred to as a "switching element".

According to an embodiment, the switch 240 may have various structures such as single pole single throw (SPST), single pole double throw (SPDT), and the like. According to an embodiment, the switch 240 may include a first terminal 241, a second terminal 242, and a third terminal 243. The switch 240 may select one of the second terminal 242 and the third terminal 243.

Figure 3:
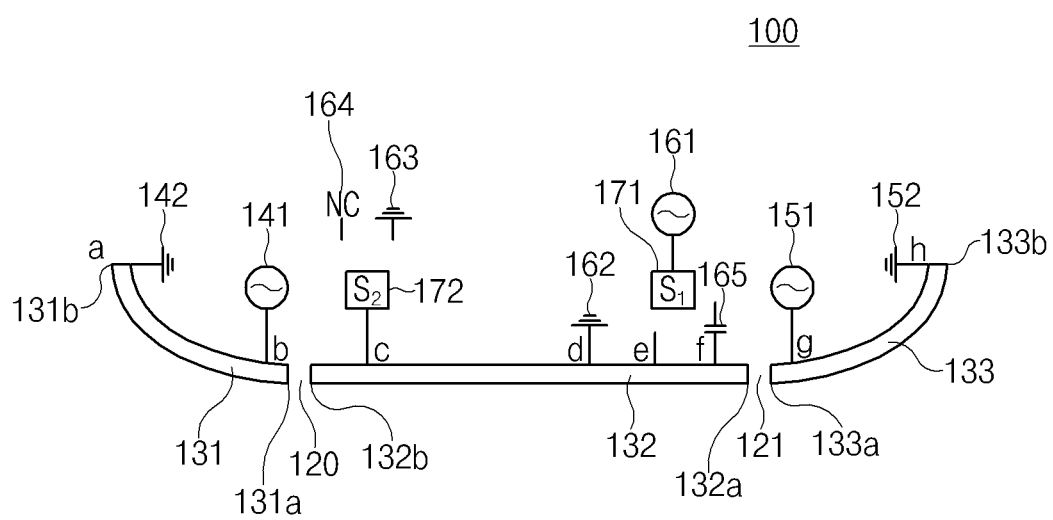
FIG. 3 illustrates an antenna structure of an electronic device according to an embodiment.

FIG. 3 illustrates an antenna structure of an electronic device according to an embodiment.

According to an embodiment, the electronic device 100 (e.g., the electronic device 100 of FIG. 1) may include the first conductive portion 131, the second conductive portion 132, and the third conductive portion 133 that are capable of operating as antennas in transferring electrical signals.

The second conductive portion 132 may be elongated from a first end 132a to a second end 132b that is opposite thereto. The first end 132a may be adjacent to or contact the second insulating portion 121, and the second end 132b may be adjacent to or contact the first insulating portion 120. The first conductive portion 131 may be elongated from a first end 131a to a second end 1321b that is opposite thereto. The first insulating portion 120 may be interposed between the first end 131a of the first conductive portion 131 and the second end 132b of the second conductive portion 132. The third conductive portion 133 may be elongated from a first end 133a to a second end 133b that is opposite thereto. The second insulating portion 121 may be interposed between the first end 133a of the third conductive portion 133 and the first end 132a of the second conductive portion 132.

According to an embodiment, when an electrical signal is supplied (or fed) to the second conductive portion 132 by a first feeding unit 161, the second conductive portion 132 may operate as an antenna element (or an antenna).

According to an embodiment, the first feeding unit 161 may directly feed the second conductive portion 132 or may indirectly feed the second conductive portion 132. According to an embodiment, the first feeding unit 161 may directly supply an electrical signal to the second conductive portion 132 or may indirectly supply an electrical signal thereto through an additional member (e.g., 165). The additional member may be a capacitive element 165 (e.g., a capacitor). Compared to the direct connection, an impedance that is formed by the second conductive portion 132 in the indirect connection through the capacitive element 165 may be relatively small.

According to an embodiment, to switch between the direction feeding and the indirect feeding, a first switching element ($S_1$) 117 (e.g., the switch 240 of FIG. 2) may be electrically connected with the second conductive portion 132. The first switching element 171 may select the direct connection of the first feeding unit 161 with the second conductive portion 132 or the indirect connection of the first feeding unit 161 with the second conductive portion 132 through the capacitive element 165.

According to an embodiment, the first switching element 171 may include a first terminal; and a second terminal and a third terminal capable of being selectively connected with the first terminal. The first terminal may be electrically connected with the first feeding unit 161, the second terminal may be electrically connected with the second conductive portion 132, and the third terminal may be electrically connected with the capacitive element 165.

According to an embodiment, the second conductive portion 132 may be electrically connected with the first switching element 171 through a conductive line. For example, the second conductive portion 132 may be electrically connected with the second terminal through a conductive line. According to an embodiment, the second conductive portion 132 may be electrically connected with the capacitive element 165 through a conductive line.

One point (hereinafter referred to as an "e point") of the second conductive portion 132 may be connected with the first switching element 171 through the conductive line, and another point (hereinafter referred to as an "f point") thereof may be electrically connected with the capacitive element 165 through the conductive line. In this case, an example is illustrated in FIG. 3 as the "e" point is more distant from the second insulating portion 121 or the third conductive portion 133 than the "f" point, but relative locations of the "e" point and the "f" point may be variously changed according to various embodiments. For example, the "f" point may be more distant from the second insulating portion 121 than the "e" point.

According to an embodiment, the second conductive portion 132 may be electrically connected with a first ground 162. The first ground 162 may be connected with the second conductive portion 132 through one point (hereinafter referred to as a "d point") of the second conductive portion 132.

According to an embodiment, one point (hereinafter referred to as a "c point") adjacent to the second end 132b facing away from the first end 132a of the second conductive portion 132 may be connected with a second ground 163 or may be opened (NC, 164). In other words, the second conductive portion 132 may be in an open state or a ground state by the "c" point.

According to an embodiment, the second conductive portion 132 may be electrically connected with a second switching element 172 (e.g., the switch 240). The second switching element 172 may allow the second conductive portion 132 to be selectively in the open or ground state.

According to an embodiment, the second switching element 172 may be in a ground state or an open state. In the ground state, the second switching element 172 may be connected with the second ground 163; in the open state, the second switching element 172 may be opened without connection with a ground or may be connected with an open element 164 having such a function. Below, a state of being connected with the second ground 163 may be referred to as a "ground state". Below, a state of being not connected with the second ground 163 or a state of being connected with the element 164 having a function associated with an open may be referred to as an "open state".

The second switching element 172 may include a first terminal, a second terminal, and a third terminal. The first terminal may be selectively connected with the second terminal or the third terminal, or the first terminal may be in a state of being connected with the second terminal or in an open state of being not connected therewith. The first terminal may be electrically connected with the second conductive portion 132. The second terminal may be electrically connected with the second ground 163. The second switching element 172 may further a third terminal, and the third terminal may be connected with the open element 164 having a function associated with an open.

According to an embodiment, the second switching element 172 may be connected with the second conductive portion 132 through the "c" point of the second conductive portion 132. The "c" point may be adjacent to the second end 132b of the second conductive portion 132 and may be interposed between the first insulating portion 120 and the "d" point.

According to an embodiment, the first conductive portion 131 may be electrically connected with a second feeding unit 141. When the second feeding unit 141 transfers an electrical signal to the first conductive portion 131, the first conductive portion 131 may operate as an antenna element (or an antenna). The first conductive portion 131 may be connected with the second feeding unit 141 in the vicinity of the first end 131a that is adjacent to or contacts the first insulating portion 120 or the second conductive portion 132. For example, the first conductive portion 131 may be connected with the second feeding unit 141 through one point (hereinafter referred to as a "b point") adjacent to the first end 131a.

According to an embodiment, an electrical connection with a third ground 142 may be made through one point (hereinafter referred to as an "a point") adjacent to a second end 131b being an opposite end of the first conductive portion 131.

According to an embodiment, a signal may be radiated to an external space through an electrical path that is formed between the "b" point and the "a" point of the first conductive portion 131.

According to an embodiment, the third conductive portion 133 may be electrically connected with a third feeding unit 151. When the third feeding unit 151 transfers an electrical signal to the third conductive portion 133, the third conductive portion 133 may operate as an antenna element (or an antenna). The third conductive portion 133 may be connected with the third feeding unit 151 in the vicinity of the first end 133a that is adjacent to or contacts the second insulating portion 121 or the second conductive portion 132. For example, the third conductive portion 133 may be connected with the third feeding unit 151 through one point (hereinafter referred to as a "g point") adjacent to the first end 133a.

According to an embodiment, an electrical connection with a fourth ground 152 may be made through one point (hereinafter referred to as an "h point") adjacent to the second end 133b being an opposite end of the third conductive portion 133.

According to an embodiment, a signal may be radiated to an external space through an electrical path that is formed between the "g" point and the "h" point of the third conductive portion 133.

According to an embodiment, at least one ground 162, 163, 142, or 152 may be electrically connected with a ground area of a substrate (e.g., the substrate 160 of FIG. 1C) of an electronic device or with at least one ground member. According to an embodiment, a conductive layer disposed in the substrate may form the ground area.

According to an embodiment, at least one feeding unit 161, 141, or 151 may be electrically connected with a communication circuit (e.g., the communication circuit 230 of FIG. 2) (e.g., an RF circuit). The communication circuit may supply an electrical signal to each conductive portion through the feeding unit.

Figure 4:
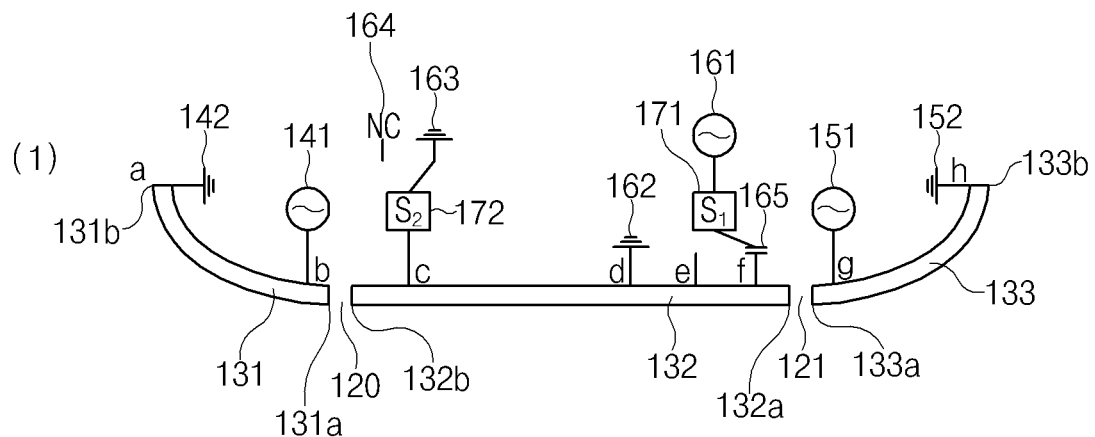
FIG. 4 is a diagram for describing an operation of an electronic device according to an embodiment of FIG. 3.
Figure 4:
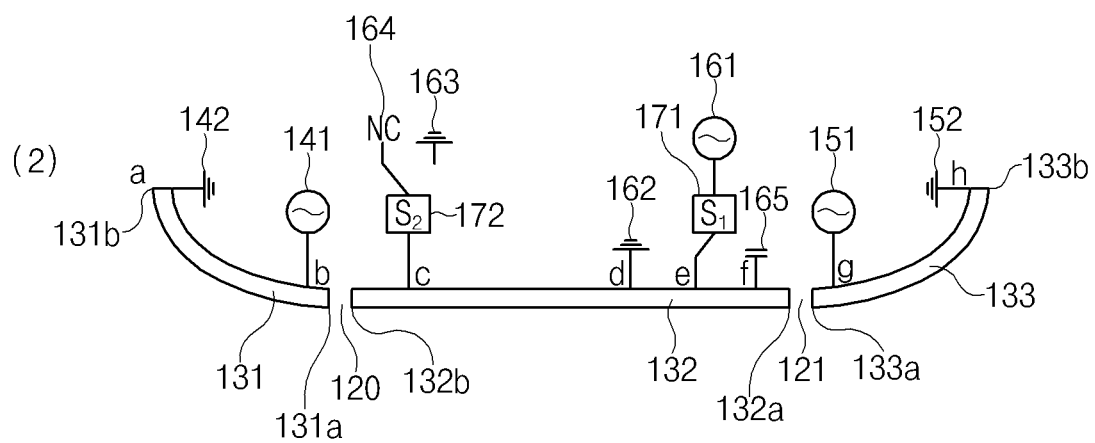

FIG. 4 is a diagram for describing an operation of an electronic device according to an embodiment of FIG. 3.

Referring to FIG. 4, when supplying an electrical signal to at least one conductive portion 131, 132, or 133, the electronic device 100 may control the first switching element 171 and/or the second switching element 172 such that performance between the conductive portions 131, 132, and 133 (or antenna elements or antennas) transferring signals is improved.

In various embodiments, a state where the conductive portion is indirectly fed like (1) of FIG. 4 may be referred to as an "indirect feeding mode", and a state where the first switching element 1721 is directly fed like (2) may be referred to as a "direct feeding mode". Also, a state where the second switching element 172 is connected with the second ground 163 like (1) of FIG. 4 may be referred to as a "ground mode", and a state where the second ground 163 is opened may be referred to as an "open mode".

According to an embodiment, the case where the electronic device 100 (or the second conductive portion 132) of FIG. 4 operates in the indirect feeding mode and the ground mode like (1) may be referred to as a "first mode", and the case where the electronic device 100 operates in the direct feeding mode and the open mode may be referred to as a "second mode".

When the electronic device 100 operates in the first mode (or the ground mode), an isolation characteristic between the second conductive portion 132 and the first conductive portion 131 may be improved by a ground adjacent to the first insulating portion 1240, and thus, the reduction of performance of the first conductive portion 131 due to the second conductive portion 132 may decrease. The electronic device 100 may set the first mode for the purpose of improving antenna performance of the first conductive portion 131.

When the electronic device 100 operates in the second mode (or the open mode), impedance between the second conductive portion 132 and the third conductive portion 133 may increase. The electronic device 100 may set the second mode for the purpose of improving antenna performance of the third conductive portion 133.

Figure 5:
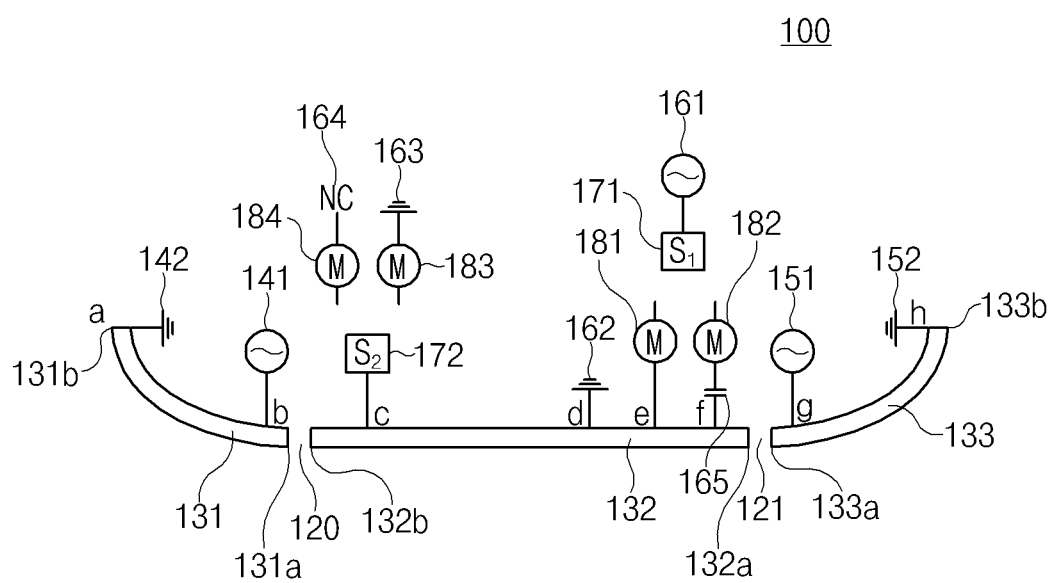
FIG. 5 illustrates an antenna structure of an electronic device according to an embodiment.

FIG. 5 illustrates an antenna structure of an electronic device according to an embodiment.

The electronic device 100 according to an embodiment may be identical or similar to the electronic device 100 of FIGS. 1A to 1C, 2, and 3. For example, the first conductive portion 131, the second conductive portion 132, the third conductive portion 133, the first feeding unit 161, the second feeding unit 141, the third feeding unit 151, the first ground 162, the second ground 163, the third ground 142, the fourth ground 152, the capacitive element 165, the open element 164, the first switching element 171, and/or the second switching element 172 of FIG. 5 may be identical or similar to the respective components of FIG. 3.

Referring to FIG. 5, the second conductive portion 132 may be electrically connected with a matching element (or a tuner) 181, 182, 183, or 184 for matching of a resonant frequency in switching between the first switching element 171 and/or the second switching element 172.

According to an embodiment, at least one matching element 181 or 182 may be interposed between the first switching element 171 and the second conductive portion 132, and at least one matching element 183 or 184 may be interposed between the second switching element 172 and the second conductive portion 132.

According to an embodiment, the first matching element 181 may be interposed between the first switching element 171 and the "e" point. When the first switching element 171 transfers a signal of the first feeding unit 161 to the second conductive portion 132, the signal may be transferred through the first matching element 181. The first matching element 181 may be electrically connected with the second terminal (refer to the description of FIG. 3) of the first switching element 171.

According to an embodiment, the second matching element 182 may be interposed between the first switching element 171 and the capacitive element 165. When the first switching element 171 transfers a signal of the first feeding unit 161 to the second conductive portion 132, the signal may be transferred to the second conductive portion 132 through the second matching element 182. The second matching element 182 may be electrically connected with the third terminal (refer to the description of FIG. 3) of the first switching element 171.

According to an embodiment, at least one matching element 183 or 184 may be interposed between the second switching element 172 and the ground 163 and/or the open element 164.

According to an embodiment, the third matching element 183 may be interposed between the second switching element 172 and the ground 163. For example, the second terminal (refer to the description of FIG. 3) of the second switching element 172 may be connected with the third matching element 183. In other words, the third matching element 183 may be interposed between the second terminal and the ground 163. When the second switching element 172 selects the ground 163, the ground 163 and the second conductive portion 132 may be connected to each other through the third matching element.

According to an embodiment, the fourth matching element 184 may be interposed between the second switching element 172 and the open element 164. For example, the third terminal (refer to the description of FIG. 3) of the second switching element 172 may be connected with the third matching element 183. When the second switching element 172 selects the ground 163, the open element 164 and the second conductive portion 132 may be connected to each other through the third matching element 183.

Figure 6:
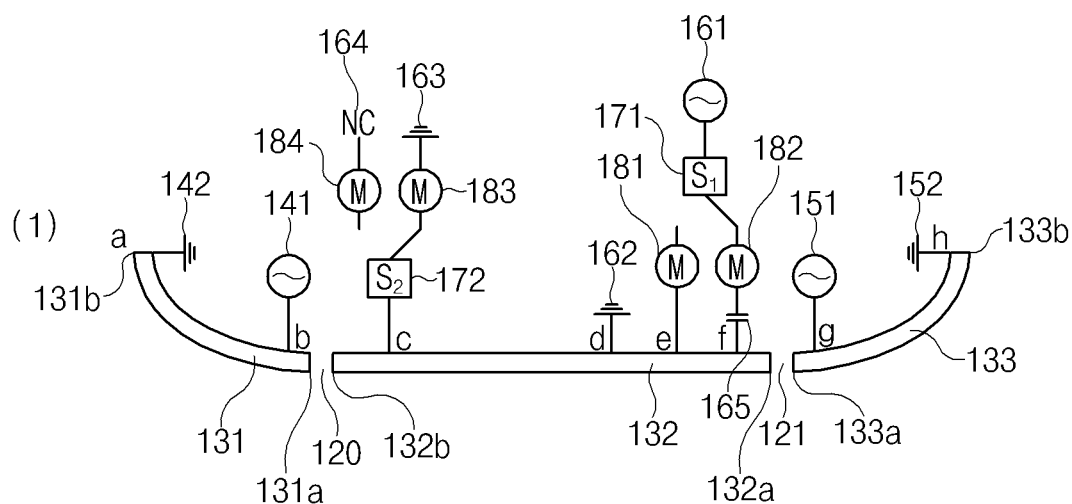
FIG. 6 is a diagram for describing an operation of an electronic device according to an embodiment.
Figure 6:
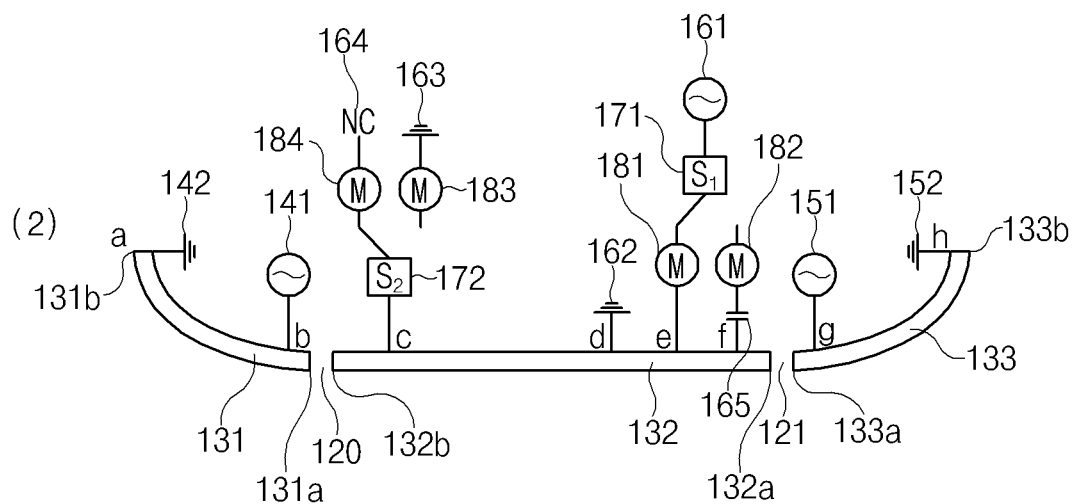

FIG. 6 is a diagram for describing an operation of an electronic device according to an embodiment.

A state where the first switching element 171 is indirectly fed like (1) of FIG. 6 may be referred to as an "indirect feeding mode", and a state where the first switching element 171 is directly fed like (2) may be referred to as a "direct feeding mode". Also, a state where the second switching element 172 is connected with the second ground 163 like (1) of FIG. 6 may be referred to as a "ground mode", and a state where the ground 163 is opened may be referred to as an "open mode".

According to an embodiment, the case where the electronic device 100 (or the second conductive portion 132) of FIG. 6 operates in the indirect feeding mode and the ground mode like (1) may be referred to as a "first mode", and the case where the electronic device 100 operates in the direct feeding mode and the open mode may be referred to as a "second mode".

A resonant frequency of the second conductive portion 132 may be maintained within a given range in switching to the first mode or the second mode, by adding the matching elements 181, 182, 183, and 184 between the first switching element 171 and the second conductive portion 132 and between the second switching element 172 and the second conductive portion 132 as illustrated in FIG. 5.

Figure 7:
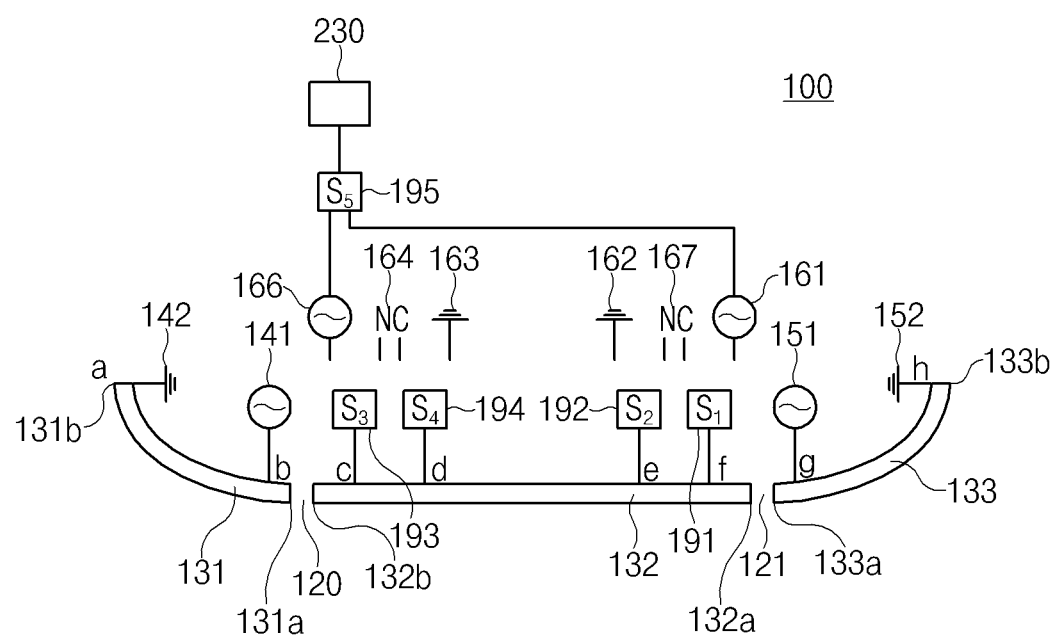
FIG. 7 illustrates an antenna structure of an electronic device according to an embodiment.

FIG. 7 illustrates an antenna structure of an electronic device according to an embodiment.

The electronic device 100 according to an embodiment may be identical or similar to the electronic device 100 of FIGS. 1A to 1C, 2, and 3. For example, the first conductive portion 131, the second conductive portion 132, the third conductive portion 133, the first feeding unit 161, the second feeding unit 141, the third feeding unit 151, the first ground 162, the second ground 163, the third ground 142, the fourth ground 152, and the open element 164 of FIG. 5 may be identical or similar to the respective components of FIG. 3. An antenna structure of the second conductive portion 132 and the first conductive portion 131 may be identical or similar to the antenna structure of the second conductive portion 132 and the first conductive portion 131 of FIG. 3. Thus, additional description will be omitted to avoid redundancy.

According to an embodiment, the electronic device 100 may be configured to change a feeding unit to be connected with the second conductive portion 132. To this end, the second conductive portion 132 may be a plurality of feeding units 161 and 166 As such, an impedance characteristic between the second conductive portion 132 and the third conductive portion 133 may be variable by changing a feeding unit to be connected with the second conductive portion 132, with the plurality of feeding units 161 and 166 provided.

Referring to FIG. 7, the electronic device 100 may include the first feeding unit 161 supplying an electrical signal to the "f" point adjacent to the first end 132a of the second conductive portion 132 and the second feeding unit 166 supplying an electrical signal through the "c" point adjacent to the second end 132b opposite to the first end 132a.

The electronic device 100 may include switching elements 191, 192, 193, and 194 such that the second conductive portion 132 is capable of being selectively connected with the first feeding unit 161 or the second feeding unit 166. According to an embodiment, the second conductive portion 132 may be in a state of being connected with the first feeding unit 161 or being not connected therewith.

To this end, the second conductive portion 132 may be electrically connected with at least one switching element 191 or 192. For example, the second conductive portion 132 may include the first switching element 191 that selectively connects the first feeding unit 161 and the second conductive portion 132. The second conductive portion 132 may include a second switching element 192 that selectively connects the first ground 162 (e.g., the first ground 162 of FIG. 3) and the second conductive portion 132.

According to an embodiment, the first switching element 191 may be selectively connected with the first feeding unit 161. The first switching element 191 may be in a feeding state or an open state. For example, in the feeding state, the first switching element 191 may be connected with the first feeding unit 161; in the open state, the first switching element 191 may be opened without connection with the first feeding unit 161 or may be connected with an open element 167.

The first switching element 191 may be implemented with an on/off type of switch capable of selectively connecting the second conductive portion 132 and the first feeding unit 161 or may be configured to selectively connect the second conductive portion 132 with the first feeding unit 161 or the second open element 167. For example, the first switching element 191 may include a first terminal to be connected with the second conductive portion 132, a second terminal to be connected with the first feeding unit 161, and a third terminal to be connected with the second open element 167. The first terminal may be selectively connected with the second terminal or the third terminal.

The second switching element 192 may be selectively connected with the first ground 162. The second switching element 192 may be in a ground state or an open state. The second switching element 192 may be connected with the first ground 162 in the ground state. In the open state, the second switching element 192 may be opened without connection with the first ground 162 or may be connected with the second open element 167.

According to an embodiment, the second switching element 192 may include a first terminal to a third terminal for the purpose of selectively connecting the second conductive portion 132 and the first ground 162 or selectively connecting the second conductive portion 132 and the second open element 167. In this case, the first terminal may be connected with the second conductive portion 132, the second terminal may be connected with the first ground 162, and the third terminal may be connected with the second open element 167.

According to an embodiment, the second open element 167 may be connected to two third terminals such that the connection with the first switching element 191 and the second switching element 192 is possible. Although not illustrated in FIG. 7, the first switching element 191 and the second switching element 192 may be respectively connected with separate open elements.

According to an embodiment, the second switching element 192 may be connected with the second conductive portion 132 through the "e" point of the second conductive portion 132. A first switching element 191 may be connected with the second conductive portion 132 through the "f" point of the second conductive portion 132. The "e" point may be a point that is more distant from the second insulating portion 121 than the "f" point.

According to an embodiment, the second conductive portion 132 may be in a state of being connected with the second feeding unit 166 or being not connected therewith.

To this end, the second conductive portion 132 may be electrically connected with at least one switching element 193 or 194. For example, the second conductive portion 132 may include the third switching element 193 that selectively connects the second feeding unit 166 and the second conductive portion 132. The second conductive portion 132 may include the fourth switching element 194 that selectively connects the second ground 163 (e.g., the second ground 163 of FIG. 3) and the second conductive portion 132. According to an embodiment, the third switching element 193 may be in a feeding state or an open state, and the fourth switching element 194 may be in a ground state or an open state. The third switching element 193 may select the second feeding unit 166 in the feeding state, and the fourth switching element 194 may select the second ground 163 in the ground state.

According to an embodiment, the third switching element 193 may be selectively connected with the second feeding unit 166. The third switching element 193 may be opened while being not connected with the second feeding unit 166. The third switching element 193 may be implemented with an on/off type of switch capable of selectively connecting the second conductive portion 132 and the second feeding unit 166 or may be configured to selectively connect the second conductive portion 132 with the second feeding unit 166 or the first open element 164. For example, the electronic device 100 may turn on the third switching element 193 for connection with the second feeding unit 166 or may turn off the third switching element 193 so as to be opened. The electronic device 100 may turn on the fourth switching element 194 for connection with the second ground 163 or may turn off the fourth switching element 194 so as to be opened. Alternatively, the third switching element 193 may include a first terminal to be connected with the second conductive portion 132, a second terminal to be connected with the second feeding unit 166, and a third terminal to be connected with the first open element 164. The first terminal may be selectively connected with the second terminal or the third terminal.

The fourth switching element 194 may be selectively connected with the second ground 163. The fourth switching element 194 may be opened while being not connected with the second ground 163. For example, the fourth switching element 194 may include a first terminal and a second terminal selectively connecting the second conductive portion 132 and the second ground 163 or the first terminal to a third terminal selectively connecting the second conductive portion 132 and the second ground 163 or the first open element 164. In this case, the first terminal may be connected with the second conductive portion 132, the second terminal may be connected with the second ground 163, and the third terminal may be connected with the first open element 164.

According to an embodiment, the first open element 164 may be connected to two third terminals such that the connection with the third switching element 193 and the fourth switching element 194 is possible. Although not illustrated in FIG. 7, the third switching element 193 and the fourth switching element 194 may be respectively connected with separate open elements.

According to an embodiment, the third switching element 193 may be connected with the second conductive portion 132 through the "c" point of the second conductive portion 132. The fourth switching element 194 may be connected with the second conductive portion 132 through the "d" point of the second conductive portion 132. The "d" point may be a point that is more distant from the first insulating portion 120 than the "c" point.

According to an embodiment, the electronic device 100 may include a fifth switching element 195 such that the communication circuit 230 (e.g., the communication circuit 230 of FIG. 2) supplies an electrical signal by selectively using the first feeding unit 161 or the second feeding unit 166.

According to an embodiment, the fifth switching element 195 may include a first terminal electrically connected with the communication circuit 230, a second terminal connected with the first feeding unit 161, and a third terminal connected with the second feeding unit 166. The first terminal may be selectively connected with the second terminal or the third terminal. The fifth switching element 195 may be controlled by the communication circuit 230 or a processor (e.g., the processor 210 of FIG. 2).

Figure 8:
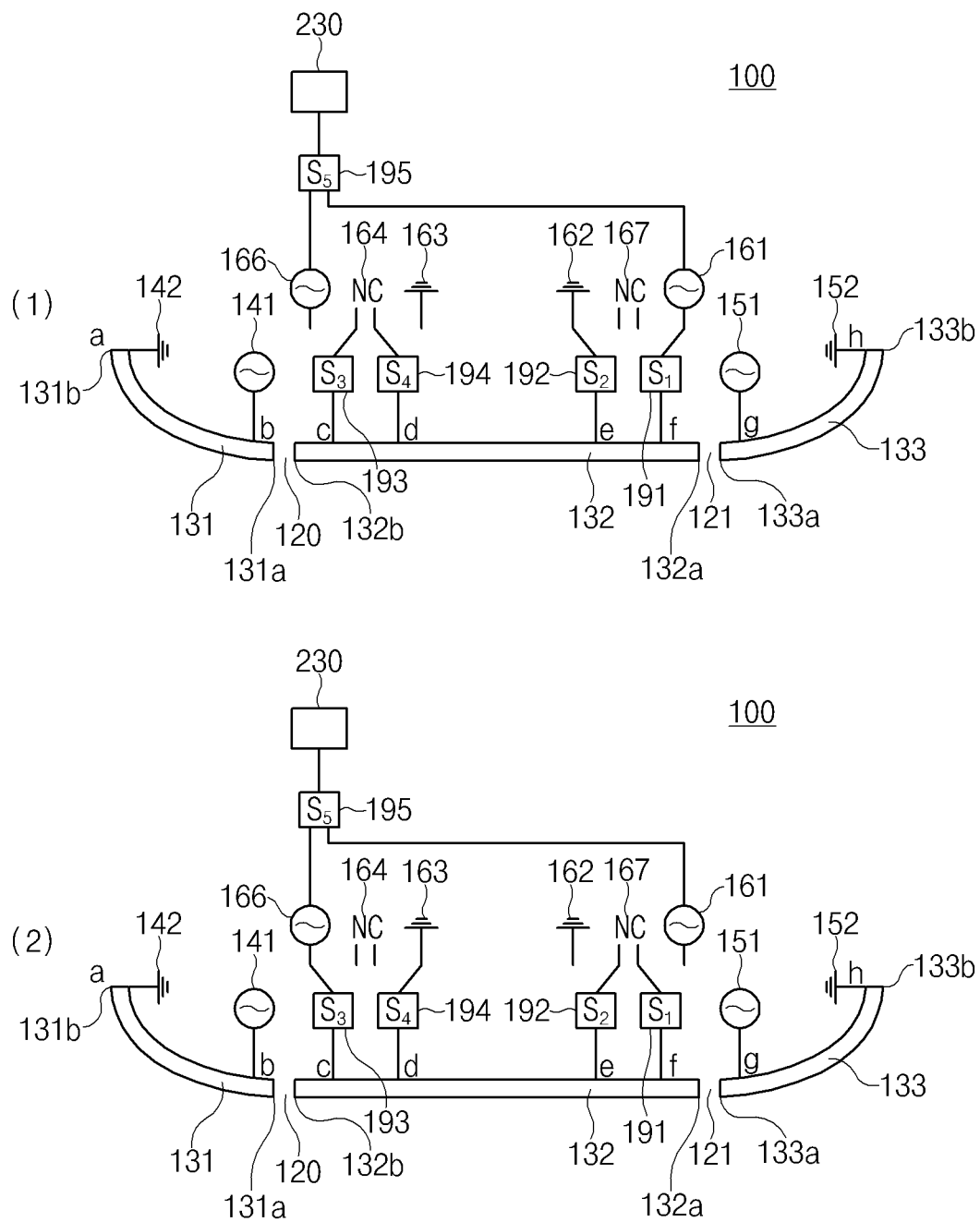
FIG. 8 is a diagram for describing an operation of an electronic device according to an embodiment.

FIG. 8 is a diagram for describing an operation of an electronic device according to an embodiment.

According to an embodiment, the electronic device 100 (e.g., the electronic device 100 of FIGS. 1A to 1C) may operate in (1) a first feeding mode or (2) a second feeding mode.

Referring to (1) of FIG. 8, in the first feeding mode, the second conductive portion 132 may be in a state of being connected with the first feeding unit 161 and the first ground 162. The second conductive portion 132 may not be connected with the second feeding unit 166 while being connected with the first feeding unit 161.

In the first feeding mode, the first terminal of the first switching element 191 may be connected with the first feeding unit 161, and the first terminal of the second switching element 192 may be connected with the first ground 162. The first terminals of the third switching element 193 and the fourth switching element 194 may be connected with the first open element 164.

Referring to (2) of FIG. 8, in the second feeding mode, the second conductive portion 132 may be in a state of being connected with the second feeding unit 166 and the second ground 163. The second conductive portion 132 may not be connected with the first feeding unit 161 while being connected with the second feeding unit 166.

In the second feeding mode, the first terminal of the third switching element 193 may be connected with the second feeding unit 166, and the first terminal of the fourth switching element 194 may be connected with the second ground 163. In the second feeding mode, the first terminal of the first switching element 191 and the first terminal of the second switching element 192 may be connected with the second open element 167.

A change in an impedance characteristic due to the change of the feeding unit described above may be used for upper and lower antennas (e.g., the second conductive portion 132 and the fifth conductive portion 136 of FIG. 1A) without separation. Also, besides the example illustrated in FIG. 1A, insulating members may be variously disposed, and various embodiments of the disclosure may be applied to the case where a housing (e.g., the housing 110 of FIG. 1A) is used as an antenna.

According to various embodiments, while the second conductive portion 132 operates in the first feeding mode, a great impedance may be formed in an area adjacent to the third conductive portion 133. The electronic device 100 may operate in the first feeding mode when good performance is necessary for the third conductive portion 133. While the second conductive portion 132 operates in the second feeding mode, a great impedance may be formed in an area adjacent to the first conductive portion 131. The electronic device 100 may operate in the second feeding mode when good performance is necessary for the first conductive portion 131.

Figure 9:
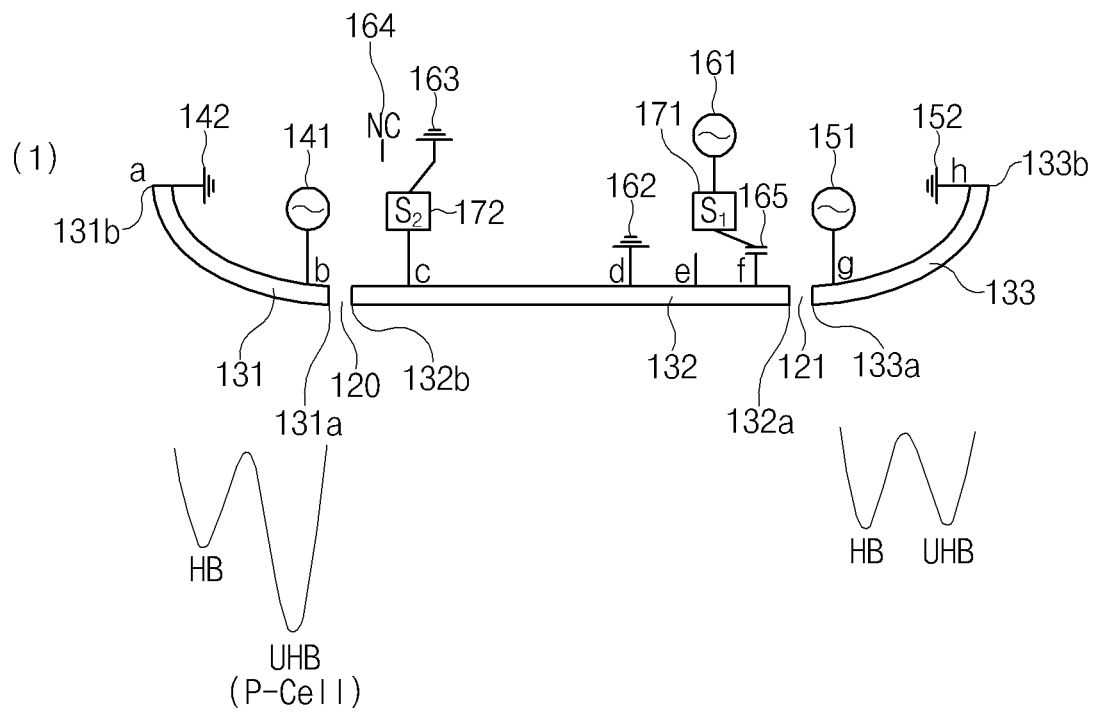
FIG. 9 illustrates an embodiment in which an antenna of an electronic device according to an embodiment is used.
Figure 9:
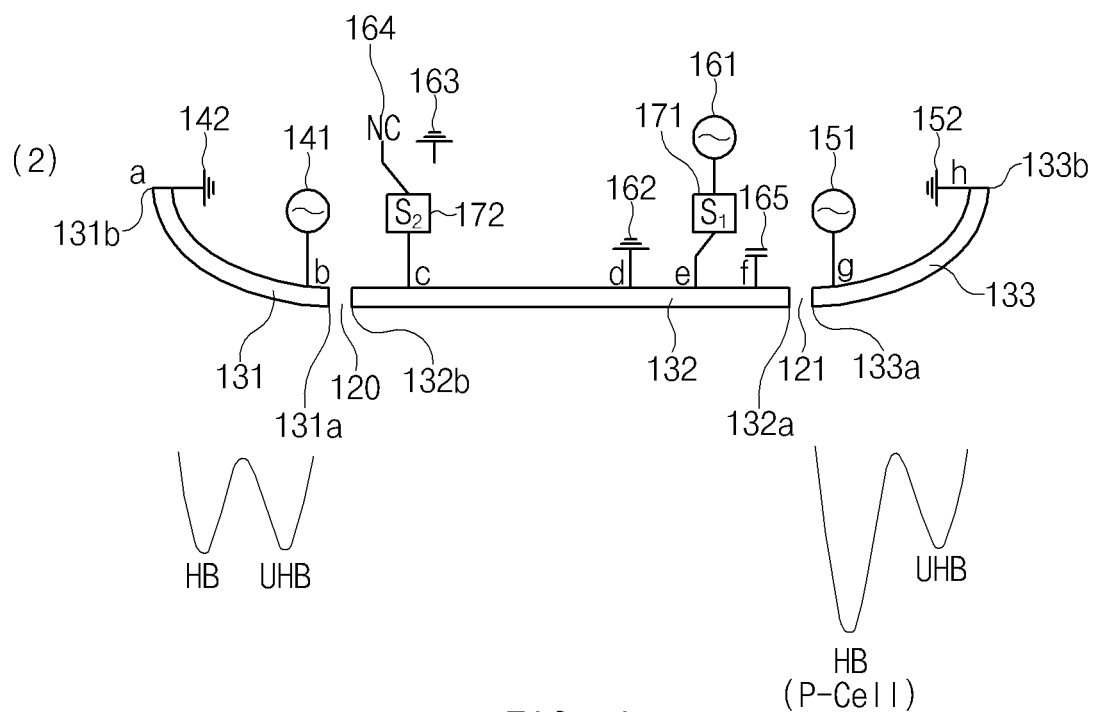

FIG. 9 illustrates an embodiment in which an antenna of an electronic device according to an embodiment is used.

According to an embodiment, the electronic device 100 may perform wireless communication supporting carrier aggregation. When the electronic device 100 performs the carrier aggregation, the electronic device 100 may transmit or receive signals in the same duration by using two or more conductive portions (e.g., the first conductive portion 131 and the second conductive portion 132).

According to an embodiment, the electronic device 100 may transmit or receive signals through a plurality of cells. A cell configured to transmit or receive a control signal from among the plurality of cells may be referred to as a "primary cell Pcell", the remaining cells other than the primary cell may be referred to as a "secondary cell Scell".

According to an embodiment, when the first conductive portion 131 or the third conductive portion 133 adjacent to the second conductive portion 132 is used, signals in two or more frequency bands may be transmitted or received depending on an operating mode (e.g., the first mode, the second mode, the first feeding mode, or the second feeding mode). According to various embodiments of the disclosure, as an isolation characteristic between conductive portions adjacent to the second conductive portion 132 is improved, Pcell may be set while transmitting/receiving signals through the conductive portions adjacent to the second conductive portion 132.

In FIG. 9, (1) indicates a connection state in the first mode of FIG. 4; in this case, as antenna performance of the first conductive portion 131 is improved, the electronic device 100 may use the first conductive portion 131 as "Pcell". In this case, "Scell" may be the second conductive portion 132. In other words, the isolation characteristic between the second conductive portion 132 and the first conductive portion 131 is improved in the indirect feeding, the first conductive portion 131 may be set to "Pcell".

In FIG. 9, (2) indicates a connection state in the second mode of FIG. 4; in this case, as antenna performance of the third conductive portion 133 is improved, the electronic device 100 may use the third conductive portion 133 as "Pcell". In this case, "Scell" may be the second conductive portion 132.

According to various embodiments of the disclosure, the electronic device 100 may use a desired frequency band as "Pcell" depending on a situation.

According to an embodiment, the first conductive portion 131 and/or the third conductive portion 133 may have a length capable of transmitting/receiving a signal in an ultra high band (UHB) or a high band (HB). Various embodiments of the disclosure may be applied to implement "Pcell" in the UHB or HB. Here, the UHB may correspond to a 3300~3800 MHz band, and the HB may correspond to a 2300~2700 MHz band.

For example, when the electronic device 100 uses the first mode in transmitting/receiving signals by using the second conductive portion 132 and the first conductive portion 131, the UHB band formed by the first conductive portion 131 may be set to "Pcell".

When the electronic device 100 uses the second mode in transmitting/receiving signals by using the second conductive portion 132 and the third conductive portion 133, the HB band formed by the third conductive portion 133 may be set to "Pcell".

Besides, signals may be efficiently transmitted/received under various ambient situations of a terminal (e.g., a grip state). For example, a decrease of performance due to the grip may be reduced by interworking with a sensor such as a grip sensor. Alternatively, in the case of gripping one side surface (e.g., the first conductive portion 131 of FIG. 1A) in his/her hand, performance of an opposite side surface (e.g., the third conductive portion 133 of FIG. 1B), and radiation performance may be improved.

According to various embodiments of the disclosure, harmful electromagnetic waves may decrease. For example, like the embodiment of FIGS. 7 and 8, as a location of a feeding unit is changed from a human body in consideration of a location of the human body, an absorption rate may decrease.

Figure 10:
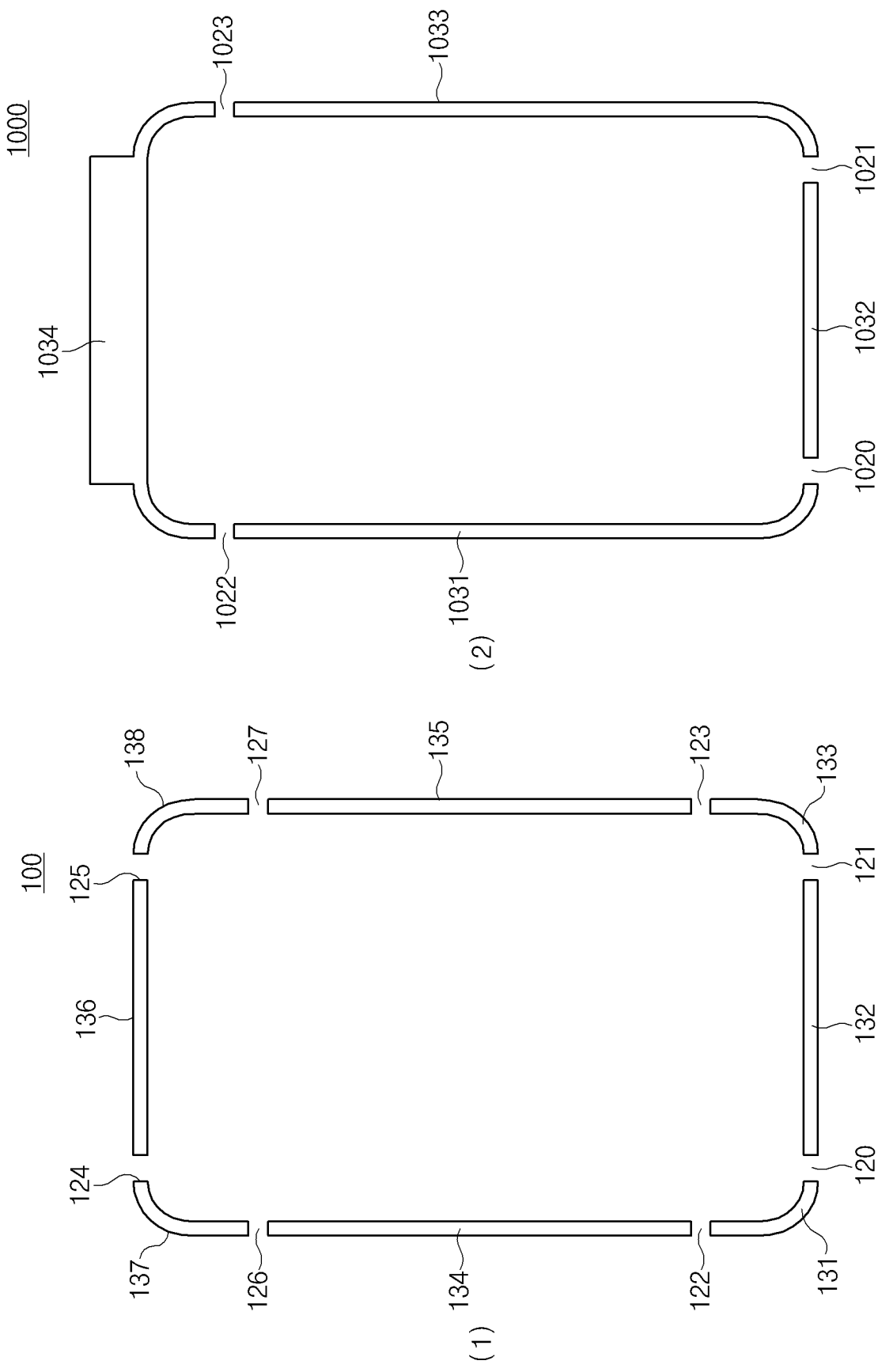
FIG. 10 illustrates an antenna according to various embodiments of the disclosure.

FIG. 10 illustrates an antenna according to various embodiments of the disclosure.

Referring to (1) and (2) of FIG. 10, a feeding change operation according to various embodiments of the disclosure may be applied to antennas to transmit/receive signals of various frequencies and conductive portions having various structures.

Referring to (1) of FIG. 10, the eighth conductive portion 135 may be fed directly or indirectly in consideration of performance of the third conductive portion 133 or the seventh conductive portion 138. For example, the eighth conductive portion 135 may make feeding connection and/or ground connection with a structure identical or similar to that of the second conductive portion 132 of FIG. 3, 5, or 7. The third conductive portion 133 or the seventh conductive portion 138 may make feeding connection and/or ground connection with a structure identical or similar to that of the first conductive portion 131 or the third conductive portion 133 of FIG. 3, 5, or 7.

The case of the eighth conductive portion 135 is exemplified above, but various conductive portions (e.g., the sixth conductive portion 136) illustrated in FIG. 10 may make feeding connection and/or ground connection with a structure identical or similar to that of the second conductive portion 132 of FIG. 3, 5, or 7.

Referring to (2) of FIG. 10, various embodiments of the disclosure may be applied to conductive portions having various structures, in addition to a structure of conductive portions included in the housing 110 of the electronic device 100 disclosed in FIGS. 1A to 1C. Conductive portions 1031, 1032, 1033, and 1034 having a structure different from that of the electronic device 100 are exemplified in (2) of FIG. 10. The conductive portions 1031, 1032, 1033, and 1034 may be spaced from each other by insulating members 1020, 1021, 1022, and 1023. The detailed description may refer to the description associated with the side member 118 of FIG. 1A.

According to an embodiment, an electronic device 1000 may use indirect feeding or direct feeding in transmitting or receiving a signal through the second conductive portion 1032. In this case, a feeding connection and ground connection scheme of the second conductive portion 1032 may refer to the description associated with the second conductive portion 132 of FIG. 3, 5, or 7. In this case, the first conductive portion 1031 and the third conductive portion 1033 may have electrical lengths different from those of the first conductive portion 131 and the third conductive portion 133 illustrated in FIG. 1A and may function as antennas to transmit or receive signals in different frequency bands. The example where the second conductive portion 1032 operates like the second conductive portion 132 of FIG. 3, 5, or 7 is described above, but an indirect feeding or direct feeding structure according to various embodiments of the disclosure may be used for the first conductive portion 1031, the third conductive portion 1033, or the fourth conductive portion 1034.

Figure 11:
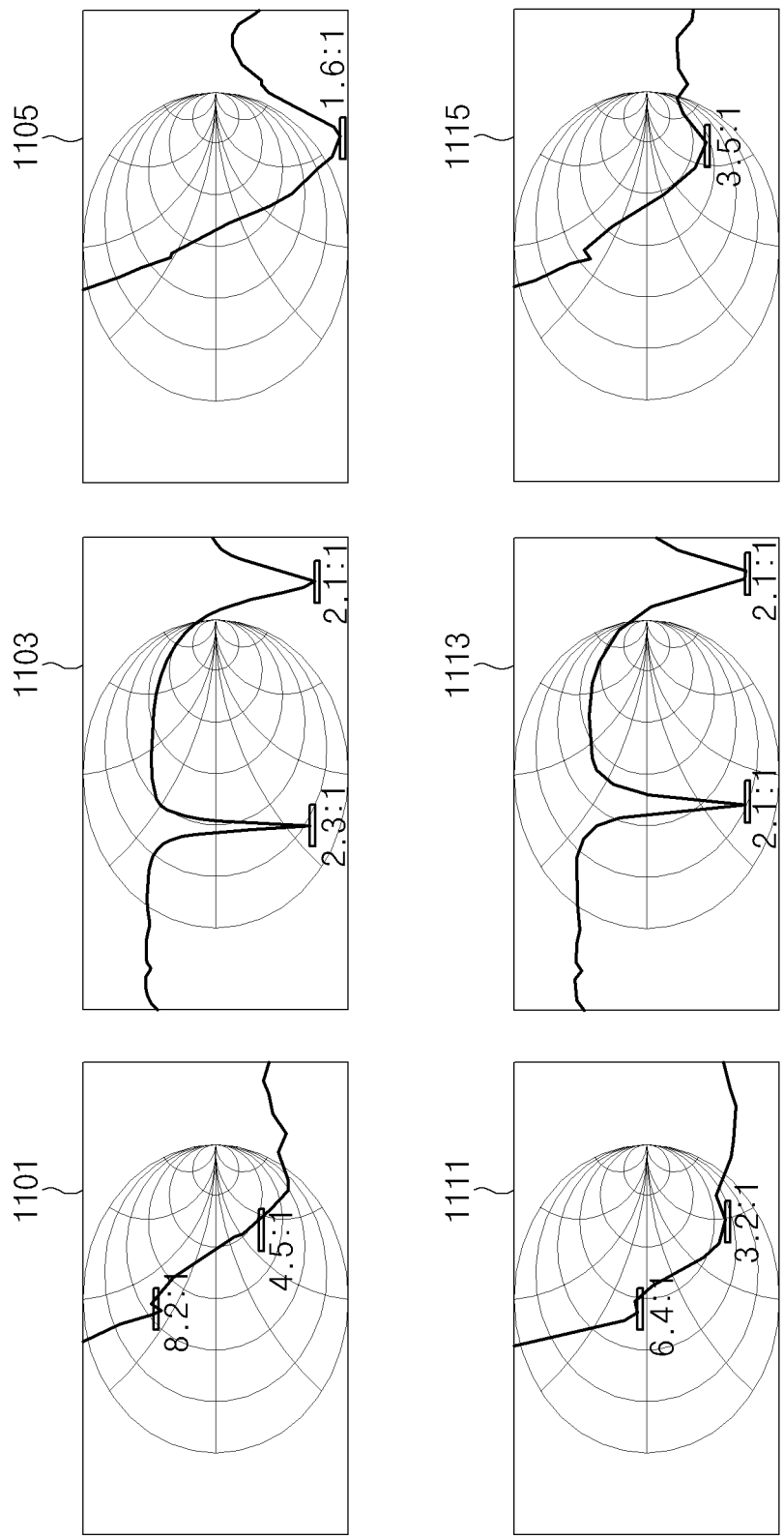
FIG. 11 is a diagram for describing an effect of an antenna according to an embodiment.

FIG. 11 is a diagram for describing an effect of an antenna according to an embodiment.

Graph 1101 to graph 1115 of FIG. 11 are smith charts indicating radiation performance of an antenna according to various embodiments of the disclosure.

Graph 1101 to graph 1105 indicate radiation performance when the second conductive portion 132 is directly fed like (2) of FIG. 4, and graph 1111 to graph 1115 indicate radiation performance when the second conductive portion 132 is indirectly fed like (1) of FIG. 4.

Table 1 below shows summarized results of the graphs.

TABLE 1

|  | First conductive portion | | Second conductive portion | | Third conductive portion |
| --- | --- | --- | --- | --- | --- |
|  | Band 1 | Band 2 | Band 3 | Band 4 | Band 5 |
| Direct feeding | 38% (8.2:1) | 59% (4.5:1) | 84% (2.3:1) | 86% (2.1:1) | 94% (1.6:1) |
| Indirect feeding | 46% (6.4:1) | 73% (3.2:1) | 86% (2.1:1) | 86% (2.1:1) | 70% (3.5:1) |
| Different | 8% | 12% | 2% | 0 | −24% |

Table 1 above shows a data value obtained by converting a VSWR value of each conductive portion into efficiency. Referring to Table 1 and the above graphs, at the second conductive portion, there is no great difference in performance according to a change between the direct feeding and the indirect feeding. In the case of adjacent antennas, it is observed that RF performance is variable as an impedance characteristic and a coupling characteristic change depending on a direct feeding or indirect feeding switch. Performance of the third conductive portion may be improved in using the direct feeding, and performance of the first conductive portion may be improved in using the indirect feeding.

In other words, in feeding the second conductive portion, the direct feeding may be used when good performance is necessary for the third conductive portion, and the indirect feeding may be used when good performance is necessary for the first conductive portion.

An electronic device (e.g., the electronic device 100 of FIGS. 1A to 1C) according to an embodiment may include a housing (e.g., the housing 110 of FIG. 1A) that includes a first plate (e.g., the first plate 102 of FIG. 1A), a second plate (e.g., the second plate 111 of FIG. 1B) facing away from the first plate, and a side member (e.g., the side member 118 of FIG. 1A) surrounding a space between the first plate and the second plate, wherein the side member includes a first conductive portion (e.g., the first conductive portion 131 of FIG. 3) including a first end (e.g., the first end 131a of FIG. 3) and being elongated, a second conductive portion (e.g., the second conductive portion 132 of FIG. 1A) including a second end (e.g., the second end 132b of FIG. 3) and a third end (e.g., the third end 133a of FIG. 3) and being elongated, the second end being adjacent to the first end, a third conductive portion (e.g., the third conductive portion 133 of FIG. 3) including a fourth end (e.g., the fourth end 133b of FIG. 3) adjacent to the third end and being elongated, a first insulating portion (e.g., the first insulating portion 120 of FIG. 3) disposed between the first end and the second end to contact the first end and the second end, and a second insulating portion (e.g., the second insulating portion 121 of FIG. 3) disposed between the third end and the fourth end to contact the third end and the fourth end, a display (e.g., the display 101 of FIG. 1A) that is exposed through the first plate, at least one wireless communication circuit (e.g., the communication circuit 230 of FIG. 2), at least one ground member, and a control circuit (e.g., the processor 210 of FIG. 2). The at least one wireless communication circuit may be electrically connected with a first point (e.g., the "b" point of FIG. 3) that is placed at the first conductive portion and is adjacent to the first end, a first switching element (e.g., the first switching element 171 of FIG. 3) that is electrically connected with a second point (e.g., the "f" point of FIG. 3), which is placed at the second conductive portion and is adjacent to the third end, through a capacitive element and is electrically connected with a third point (e.g., the "e" point of FIG. 3) placed at the second conductive portion and adjacent to the third end, and a fourth point (e.g., the "g" point of FIG. 3) that is placed at the third conductive portion and is adjacent to the fourth end. The at least one ground member may be electrically connected with a fifth point (e.g., the "a" point of FIG. 3) that is placed at the first conductive portion and is more distant from the first end than the first point, a second switching element (e.g., the second switching element 172 of FIG. 3) that is electrically connected with a sixth point (e.g., the "c" point of FIG. 3) placed at the second conductive portion and adjacent to the second end, a seventh point (e.g., the "d" point of FIG. 3) that is placed at the second conductive portion and is adjacent to the third point, and an eighth point (e.g., the "h" point of FIG. 3) that is placed at the third conductive portion and is more distant from the fourth end than the fourth point. The control circuit may be configured to control the first switching element and the second switching element.

According to an embodiment, the control circuit may include an application processor.

According to an embodiment, the control circuit may allow the first switching element to select the capacitive element and the second switching element to select the at least ground member, in a first duration. According to an embodiment, the control circuit may allow the first switching element to select the third point and the second switching element not to select the at least ground member, in a second duration.

According to an embodiment, the electronic device may include a matching element (e.g., the matching element 181 of FIG. 5) between at least one of the second point or the third point and the first switching element.

According to an embodiment, the electronic device may further include a matching element (e.g., the matching element 183 of FIG. 5) between the at least one ground member and the second switching element.

According to an embodiment, the seventh point may be electrically connected with the at least one ground member.

According to an embodiment, the seventh point may be more distant from the third end than at least one of the second point or the third point.

According to an embodiment, the control circuit may be configured to transmit or receive a signal in a first frequency band through the first conductive portion in the first duration and to transmit or receive a signal in a second frequency band in a third duration, of which at least a portion overlaps the first duration, through the second conductive portion. The first frequency band may correspond, for example, a 3300-3800 MHz band. The second frequency band may correspond, for example, a 2300-2700 MHz band.

According to an embodiment, a Pcell may be set to the first frequency band.

According to an embodiment, the control circuit may be configured to transmit or receive a signal in a third frequency band through the second conductive portion in the second duration and to transmit or receive a signal in a fourth duration, of which at least a portion overlaps the second duration, through the third conductive portion. The third frequency band may correspond, for example, a 2300-2700 MHz band. The fourth frequency band may correspond, for example, a 3300-3800 MHz band.

According to an embodiment, a Pcell may be set to the fourth frequency band.

According to an embodiment, the second switching element may be electrically connected with an open element (e.g., the open element 164 of FIG. 3).

An electronic device (e.g., the electronic device 100 of FIGS. 1A to 1C) according to an embodiment may include a housing (e.g., the housing 110 of FIG. 1A) that includes a first plate (e.g., the first plate 102 of FIG. 1A), a second plate (e.g., the second plate 111 of FIG. 1B) facing away from the first plate, and a side member (e.g., the side member 118 of FIG. 1A) surrounding a space between the first plate and the second plate, wherein the side member includes a first conductive portion (e.g., the first conductive portion 131 of FIG. 3) including a first end and being elongated, a second conductive portion (e.g., the second conductive portion 132 of FIG. 1A) including a second end (e.g., the second end 132b of FIG. 3) and a third end (e.g., the third end 133a of FIG. 3) and being elongated, a third conductive portion (e.g., the third conductive portion 133 of FIG. 3) including a fourth end (e.g., the fourth end 133b of FIG. 3) adjacent to the third end and being elongated, a first insulating portion (e.g., the first insulating portion 120 of FIG. 3) disposed between the first end and the second end to contact the first end and the second end, and a second insulating portion (e.g., the second insulating portion 121 of FIG. 3) disposed between the third end and the fourth end to contact the third end and the fourth end, a display (e.g., the display 101 of FIG. 1A) that is exposed through the first plate, at least one wireless communication circuit (e.g., the communication circuit 230 of FIG. 2), at least one ground member, and a control circuit (e.g., the processor 220 of FIG. 2). The at least one wireless communication circuit may be electrically connected with a first point (e.g., the "b" point of FIG. 8) that is placed at the first conductive portion and is adjacent to the first end, a first switching element (e.g., the switching element 193 of FIG. 8) that is electrically connected with a second point (e.g., the "f" point of FIG. 8) placed at the second conductive portion and adjacent to the third end, a second switching element (e.g., the switching element 191 of FIG. 8) that is electrically connected with a third point (e.g., the "c" point of FIG. 8) placed at the second conductive portion and adjacent to the second end, and a fourth point (e.g., the "g" point of FIG. 8) that is placed at the third conductive portion and is adjacent to the fourth end. The at least one ground member may be electrically connected with a fifth point (e.g., the "a" point of FIG. 8) that is placed at the first conductive portion and is more distant from the first end than the first point, a third switching element (e.g., the switching element 19 of FIG. 8) that is electrically connected with a sixth point (e.g., the "d" point of FIG. 8) placed at the second conductive portion and adjacent to the second end, a fourth switching element (e.g., the switching element 192) that is electrically connected with a seventh point (e.g., the "e" point of FIG. 8) placed at the second conductive portion and adjacent to the second end, and an eighth point (e.g., the "h" point of FIG. 8) that is placed at the third conductive portion and is more distant from the fourth end than the fourth point. The control circuit may be configured to control the first switching element to the fourth switching element.

According to an embodiment, in a first duration, the control circuit may allow the first switching element to select the at least wireless communication circuit and the fourth switching element to select the at least one ground member, and may allow the second switching element not to select the at least one wireless communication circuit and the third switching element not to select the at least one ground member.

According to an embodiment, in a second duration, the control circuit may allow the first switching element not to select the at least wireless communication circuit and the fourth switching element not to select the at least one ground member, and, in the second duration, may allow the second switching element to select the at least one wireless communication circuit and the third switching element to select the at least one ground member.

According to an embodiment, in the first duration, the control circuit may allow the second switching element and the third switching element to be connected with an open element (e.g., the open element 161 or the open element 164 of FIG. 8).

According to an embodiment, in the second duration, the control circuit may allow the first switching element and the fourth switching element to be connected with an open element.

According to an embodiment, the seventh point may be more distant from the third end than the second point.

According to an embodiment, the sixth point may be more distant from the second end than the third point.

Figure 12:
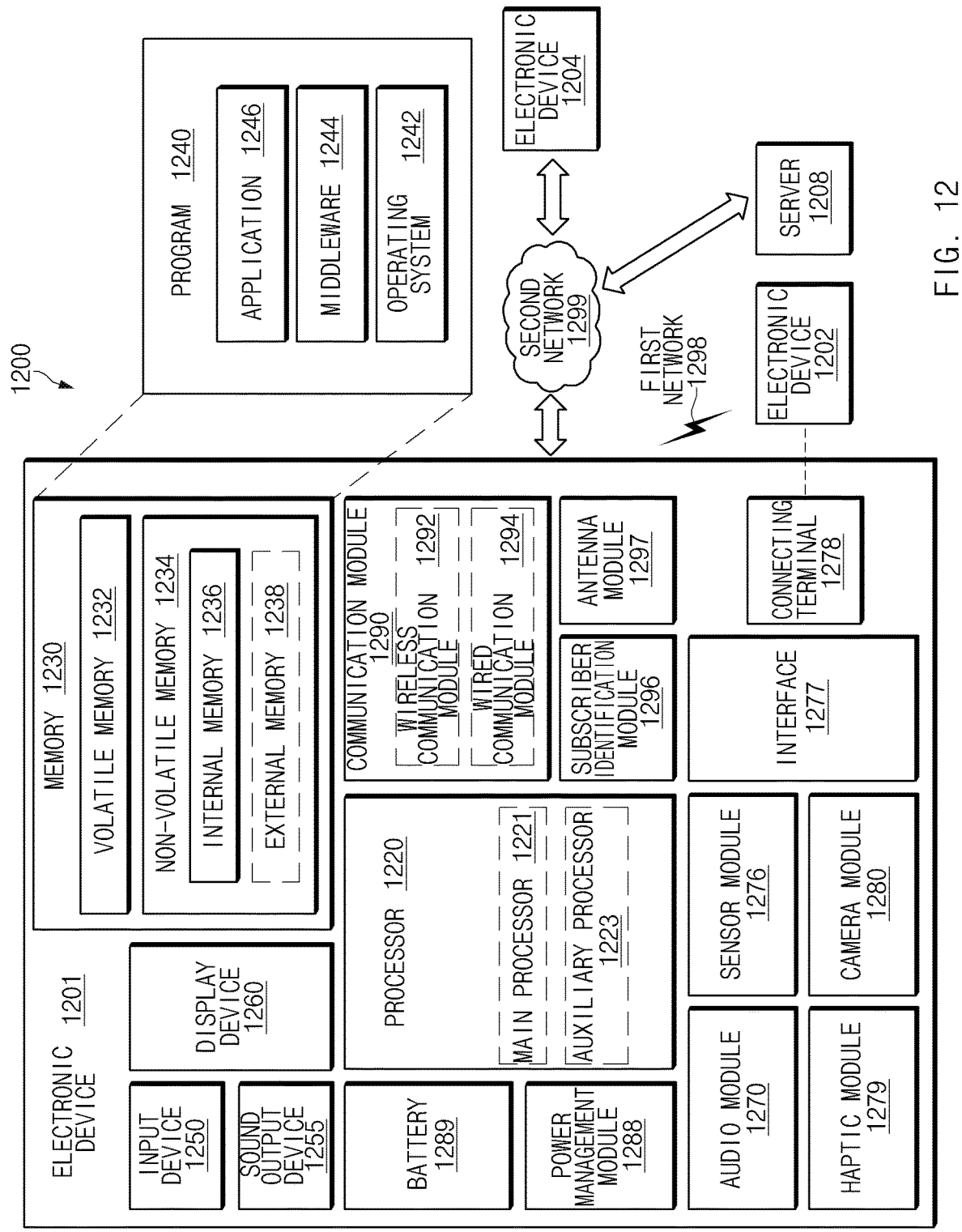
FIG. 12 is a block diagram of an electronic device in a network environment, according to various embodiments.

FIG. 12 is a block diagram illustrating an electronic device 1201 in a network environment 1200 according to various embodiments. Referring to FIG. 12, the electronic device 1201 in the network environment 1200 may communicate with an electronic device 1202 via a first network 1298 (e.g., a short-range wireless communication network), or an electronic device 1204 or a server 1208 via a second network 1299 (e.g., a long-range wireless communication network). According to an embodiment, the electronic device 1201 may communicate with the electronic device 1204 via the server 1208.

According to an embodiment, the electronic device 1201 may include a processor 1220, memory 1230, an input device 1250, a sound output device 1255, a display device 1260, an audio module 1270, a sensor module 1276, an interface 1277, a haptic module 1279, a camera module 1280, a power management module 1288, a battery 1289, a communication module 1290, a subscriber identification module (SIM) 1296, or an antenna module 1297. In some embodiments, at least one (e.g., the display device 1260 or the camera module 1280) of the components may be omitted from the electronic device 1201, or one or more other components may be added in the electronic device 1201. In some embodiments, some of the components may be implemented as single integrated circuitry. For example, the sensor module 1276 (e.g., a fingerprint sensor, an iris sensor, or an illuminance sensor) may be implemented as embedded in the display device 1260 (e.g., a display).

The processor 1220 may execute, for example, software (e.g., a program 1240) to control at least one other component (e.g., a hardware or software component) of the electronic device 1201 coupled with the processor 1220, and may perform various data processing or computation. According to one embodiment, as at least part of the data processing or computation, the processor 1220 may load a command or data received from another component (e.g., the sensor module 1276 or the communication module 1290) in volatile memory 1232, process the command or the data stored in the volatile memory 1232, and store resulting data in non-volatile memory 1234. According to an embodiment, the processor 1220 may include a main processor 1221 (e.g., a central processing unit (CPU) or an application processor (AP)), and an auxiliary processor 1223 (e.g., a graphics processing unit (GPU), an image signal processor (ISP), a sensor hub processor, or a communication processor (CP)) that is operable independently from, or in conjunction with, the main processor 1221. Additionally or alternatively, the auxiliary processor 1223 may be adapted to consume less power than the main processor 1221, or to be specific to a specified function. The auxiliary processor 1223 may be implemented as separate from, or as part of the main processor 1221.

The auxiliary processor 1223 may control at least some of functions or states related to at least one component (e.g., the display device 1260, the sensor module 1276, or the communication module 1290) among the components of the electronic device 1201, instead of the main processor 1221 while the main processor 1221 is in an inactive (e.g., sleep) state, or together with the main processor 1221 while the main processor 1221 is in an active state (e.g., executing an application). According to an embodiment, the auxiliary processor 1223 (e.g., an image signal processor or a communication processor) may be implemented as part of another component (e.g., the camera module 1280 or the communication module 1290) functionally related to the auxiliary processor 1223.

The memory 1230 may store various data used by at least one component (e.g., the processor 1220 or the sensor module 1276) of the electronic device 1201. The various data may include, for example, software (e.g., the program 1240) and input data or output data for a command related thereto. The memory 1230 may include the volatile memory 1232 or the non-volatile memory 1234.

The program 1240 may be stored in the memory 1230 as software, and may include, for example, an operating system (OS) 1242, middleware 1244, or an application 1246.

The input device 1250 may receive a command or data to be used by other component (e.g., the processor 1220) of the electronic device 1201, from the outside (e.g., a user) of the electronic device 1201. The input device 1250 may include, for example, a microphone, a mouse, a keyboard, or a digital pen (e.g., a stylus pen).

The sound output device 1255 may output sound signals to the outside of the electronic device 1201. The sound output device 1255 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 1260 may visually provide information to the outside (e.g., a user) of the electronic device 1201. The display device 1260 may include, for example, a display, a hologram device, or a projector and control circuitry to control a corresponding one of the display, hologram device, and projector. According to an embodiment, the display device 1260 may include touch circuitry adapted to detect a touch, or sensor circuitry (e.g., a pressure sensor) adapted to measure the intensity of force incurred by the touch.

The audio module 1270 may convert a sound into an electrical signal and vice versa. According to an embodiment, the audio module 1270 may obtain the sound via the input device 1250, or output the sound via the sound output device 1255 or a headphone of an external electronic device (e.g., an electronic device 1202) directly (e.g., wiredly) or wirelessly coupled with the electronic device 1201.

The sensor module 1276 may detect an operational state (e.g., power or temperature) of the electronic device 1201 or an environmental state (e.g., a state of a user) external to the electronic device 1201, and then generate an electrical signal or data value corresponding to the detected state. According to an embodiment, the sensor module 1276 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1277 may support one or more specified protocols to be used for the electronic device 1201 to be coupled with the external electronic device (e.g., the electronic device 1202) directly (e.g., wiredly) or wirelessly. According to an embodiment, the interface 1277 may include, for example, a high definition multimedia interface (HDMI), a universal serial bus (USB) interface, a secure digital (SD) card interface, or an audio interface.

A connecting terminal 1278 may include a connector via which the electronic device 1201 may be physically connected with the external electronic device (e.g., the electronic device 1202). According to an embodiment, the connecting terminal 1278 may include, for example, a HDMI connector, a USB connector, a SD card connector, or an audio connector (e.g., a headphone connector).

The haptic module 1279 may convert an electrical signal into a mechanical stimulus (e.g., a vibration or a movement) or electrical stimulus which may be recognized by a user via his tactile sensation or kinesthetic sensation. According to an embodiment, the haptic module 1279 may include, for example, a motor, a piezoelectric element, or an electric stimulator.

The camera module 1280 may capture a still image or moving images. According to an embodiment, the camera module 1280 may include one or more lenses, image sensors, image signal processors, or flashes.

The power management module 1288 may manage power supplied to the electronic device 1201. According to one embodiment, the power management module 1288 may be implemented as at least part of, for example, a power management integrated circuit (PMIC).

The battery 1289 may supply power to at least one component of the electronic device 1201. According to an embodiment, the battery 1289 may include, for example, a primary cell which is not rechargeable, a secondary cell which is rechargeable, or a fuel cell.

The communication module 1290 may support establishing a direct (e.g., wired) communication channel or a wireless communication channel between the electronic device 1201 and the external electronic device (e.g., the electronic device 1202, the electronic device 1204, or the server 1208) and performing communication via the established communication channel. The communication module 1290 may include one or more communication processors that are operable independently from the processor 1220 (e.g., the application processor (AP)) and supports a direct (e.g., wired) communication or a wireless communication. According to an embodiment, the communication module 1290 may include a wireless communication module 1292 (e.g., a cellular communication module, a short-range wireless communication module, or a global navigation satellite system (GNSS) communication module) or a wired communication module 1294 (e.g., a local area network (LAN) communication module or a power line communication (PLC) module). A corresponding one of these communication modules may communicate with the external electronic device via the first network 1298 (e.g., a short-range communication network, such as Bluetooth™, wireless-fidelity (Wi-Fi) direct, or infrared data association (IrDA)) or the second network 1299 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1292 may identify and authenticate the electronic device 1201 in a communication network, such as the first network 1298 or the second network 1299, using subscriber information (e.g., international mobile subscriber identity (IMSI)) stored in the subscriber identification module 1296.

The antenna module 1297 may transmit or receive a signal or power to or from the outside (e.g., the external electronic device) of the electronic device 1201. According to an embodiment, the antenna module 1297 may include an antenna including a radiating element composed of a conductive material or a conductive pattern formed in or on a substrate (e.g., PCB). According to an embodiment, the antenna module 1297 may include a plurality of antennas. In such a case, at least one antenna appropriate for a communication scheme used in the communication network, such as the first network 1298 or the second network 1299, may be selected, for example, by the communication module 1290 (e.g., the wireless communication module 1292) from the plurality of antennas. The signal or the power may then be transmitted or received between the communication module 1290 and the external electronic device via the selected at least one antenna. According to an embodiment, another component (e.g., a radio frequency integrated circuit (RFIC)) other than the radiating element may be additionally formed as part of the antenna module 1297.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1201 and the external electronic device 1204 via the server 1208 coupled with the second network 1299. Each of the electronic devices 1202 and 1204 may be a device of a same type as, or a different type, from the electronic device 1201. According to an embodiment, all or some of operations to be executed at the electronic device 1201 may be executed at one or more of the external electronic devices 1202, 1204, or 1208. For example, if the electronic device 1201 should perform a function or a service automatically, or in response to a request from a user or another device, the electronic device 1201, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1201. The electronic device 1201 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1240) including one or more instructions that are stored in a storage medium (e.g., internal memory 1236 or external memory 1238) that is readable by a machine (e.g., the electronic device 1201). For example, a processor (e.g., the processor 1220) of the machine (e.g., the electronic device 1201) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An electronic device comprising:
   a housing including a first plate, a second plate facing away from the first plate, and a side member surrounding a space between the first plate and the second plate, wherein the side member includes:
   a first conductive portion including a first end and being elongated;
   a second conductive portion including a second end and a third end and being elongated, the second end being adjacent to the first end;
   a third conductive portion including a fourth end adjacent to the third end and being elongated;
   a first insulating portion disposed between the first end and the second end to contact the first end and the second end; and
   a second insulating portion disposed between the third end and the fourth end to contact the third end and the fourth end;
   a display exposed through the first plate;
   at least one wireless communication circuit electrically connected with:
   a first point placed at the first conductive portion and adjacent to the first end;
   a first switching element electrically connected with a second point, which is placed at the second conductive portion and is adjacent to the third end, through a capacitive element and electrically connected with a third point placed at the second conductive portion and adjacent to the third end; and
   a fourth point placed at the third conductive portion and adjacent to the fourth end;
   at least one ground member electrically connected with:
   a fifth point placed at the first conductive portion and more distant from the first end than the first point;
   a second switching element electrically connected with a sixth point placed at the second conductive portion and adjacent to the second end;
   a seventh point placed at the second conductive portion and adjacent to the third point; and
   an eighth point placed at the third conductive portion and more distant from the fourth end than the fourth point; and
   a control circuit configured to control the first switching element and the second switching element.

2. The electronic device of claim 1, wherein the control circuit includes an application processor.

3. The electronic device of claim 1, wherein the control circuit allows the first switching element to select the capacitive element and the second switching element to select the at least ground member, in a first duration.

4. The electronic device of claim 3, wherein the control circuit allows the first switching element to select the third point and the second switching element not to select the at least ground member, in a second duration.

5. The electronic device of claim 4, wherein the control circuit is configured to:
   transmit or receive a signal in a third frequency band through the second conductive portion in the second duration; and
   transmit or receive a signal in a fourth frequency band in a fourth duration, of which at least a portion overlaps the second duration, through the third conductive portion.

6. The electronic device of claim 5, wherein a Pcell is set to the fourth frequency band.

7. The electronic device of claim 4, wherein the second switching element is electrically connected with an open element.

8. The electronic device of claim 3, wherein the control circuit is configured to:
   transmit or receive a signal in a first frequency band through the first conductive portion in the first duration; and
   transmit or receive a signal in a second frequency band in a third duration, of which at least a portion overlaps the first duration, through the second conductive portion.

9. The electronic device of claim 8, wherein a Pcell is set to the first frequency band.

10. The electronic device of claim 1, wherein at least one of the second point or the third point includes a matching element between with the first switching element.

11. The electronic device of claim 1, further comprising:
   a matching element between the at least one ground member and the second switching element.

12. The electronic device of claim 1, wherein the seventh point is electrically connected with the at least one ground member.

13. The electronic device of claim 1, wherein the seventh point is more distant from the third end than at least one of the second point or the third point.

14. An electronic device comprising:
a housing including a first plate, a second plate facing away from the first plate, and a side member surrounding a space between the first plate and the second plate, wherein the side member includes:
  a first conductive portion including a first end and being elongated;
  a second conductive portion including a second end and a third end and being elongated, the second end being adjacent to the first end;
  a third conductive portion including a fourth end adjacent to the third end and being elongated;
  a first insulating portion disposed between the first end and the second end to contact the first end and the second end; and
  a second insulating portion disposed between the third end and the fourth end to contact the third end and the fourth end;
a display exposed through the first plate;
at least one wireless communication circuit electrically connected with:
  a first point placed at the first conductive portion and adjacent to the first end;
  a first switching element electrically connected with a second point placed at the second conductive portion and adjacent to the third end;
  a second switching element electrically connected with a third point placed at the second conductive portion and adjacent to the second end; and
  a fourth point placed at the third conductive portion and adjacent to the fourth end;
at least one ground member electrically connected with:
  a fifth point placed at the first conductive portion and more distant from the first end than the first point;
  a third switching element electrically connected with a sixth point placed at the second conductive portion and adjacent to the second end;
  a fourth switching element electrically connected with a seventh point placed at the second conductive portion and adjacent to the second end; and
  an eighth point placed at the third conductive portion and more distant from the fourth end than the fourth point; and
a control circuit configured to control the first switching element to the fourth switching element.

15. The electronic device of claim 14, wherein, in a first duration, the control circuit allows the first switching element to select the at least wireless communication circuit and the fourth switching element to select the at least one ground member, and allows the second switching element not to select the at least one wireless communication circuit and the third switching element not to select the at least one ground member.

* * * * *